(12) United States Patent
Krummacher et al.

(10) Patent No.: US 9,337,447 B2
(45) Date of Patent: May 10, 2016

(54) RADIATION EMITTING DEVICE

(75) Inventors: Benjamin Claus Krummacher, Regensburg (DE); Heinz Pudleiner, Krefeld (DE); Klaus Meyer, Dormagen (DE)

(73) Assignees: OSRAM OLED GmbH, Regensburg (DE); Covestro Deutschland AG, Leverkusen (DE)

( * ) Notice: Subject to any disclaimer, the term of this patent is extended or adjusted under 35 U.S.C. 154(b) by 4 days.

(21) Appl. No.: 13/378,919

(22) PCT Filed: Jun. 16, 2010

(86) PCT No.: PCT/EP2010/058481
§ 371 (c)(1),
(2), (4) Date: Mar. 28, 2012

(87) PCT Pub. No.: WO2010/146091
PCT Pub. Date: Dec. 23, 2010

(65) Prior Publication Data
US 2012/0193645 A1 Aug. 2, 2012

(30) Foreign Application Priority Data

Jun. 16, 2009 (DE) .................. 10 2009 025 123

(51) Int. Cl.
*H01L 51/52* (2006.01)
(52) U.S. Cl.
CPC ........ *H01L 51/5275* (2013.01); *H01L 51/5268* (2013.01)
(58) Field of Classification Search
CPC ..... H01L 33/58; H01L 51/52; H01L 51/5275; H01L 51/5268

USPC ........................................................... 257/79
See application file for complete search history.

(56) References Cited

U.S. PATENT DOCUMENTS

| 2,991,273 A | 7/1961 | Hechelhammer et al. |
| 2,999,835 A | 9/1961 | Goldberg |

(Continued)

FOREIGN PATENT DOCUMENTS

| CN | 1714460 | 12/2005 |
| CN | 101019250 | 8/2007 |

(Continued)

OTHER PUBLICATIONS

H. Greiner, "Light extraction from organic light emitting diode substrates: Simulation and Experiment", Japanese Journal of Applied Physics, Japan Society of Applied Physics, vol. 46, No. 7A, pp. 4125-4137, Jul. 1, 2007.

(Continued)

*Primary Examiner* — Evan Pert
*Assistant Examiner* — Damon Hillman
(74) *Attorney, Agent, or Firm* — Cozen O'Connor

(57) ABSTRACT

A radiation-emitting device having an organic radiation-emitting functional layer and a radiation decoupling layer. The organic radiation-emitting functional layer emits a primary radiation; the radiation decoupling layer is disposed in the beam path of the primary radiation. On the side remote from the radiation-emitting functional layer the radiation decoupling layer comprises a microstructure having regularly disposed geometric structural elements; at least partial regions of the radiation decoupling layer contain regions which effect scattering of the primary radiation.

18 Claims, 6 Drawing Sheets

(56) References Cited

U.S. PATENT DOCUMENTS

| | | | |
|---|---|---|---|
| 2,999,846 A | 9/1961 | Schnell et al. |
| 3,148,172 A | 9/1964 | Fox |
| 3,189,662 A | 6/1965 | Vaughn, Jr. |
| 3,271,367 A | 9/1966 | Schnell et al. |
| 3,419,634 A | 12/1968 | Vaughn, Jr. |
| 3,494,885 A | 2/1970 | Thompson et al. |
| 3,553,167 A | 1/1971 | Schnell et al. |
| 3,752,048 A | 8/1973 | Tokutomi |
| 3,793,402 A | 2/1974 | Owens |
| 3,808,180 A | 4/1974 | Owens |
| 3,821,325 A | 6/1974 | Merritt, Jr. et al. |
| 3,832,419 A | 8/1974 | Merritt, Jr. |
| 3,879,348 A | 4/1975 | Serini et al. |
| 4,226,752 A | 10/1980 | Erickson et al. |
| 4,334,053 A | 6/1982 | Freitag et al. |
| 4,368,240 A | 1/1983 | Nauta et al. |
| 4,386,186 A | 5/1983 | Maresca et al. |
| 4,584,360 A | 4/1986 | Paul et al. |
| 4,600,753 A | 7/1986 | Freitag et al. |
| 4,661,580 A | 4/1987 | Ranade |
| 4,680,371 A | 7/1987 | Rosenfeld et al. |
| 4,680,372 A | 7/1987 | Rosenfeld |
| 4,707,393 A | 11/1987 | Vetter |
| 4,982,014 A | 1/1991 | Freitag et al. |
| 5,235,026 A | 8/1993 | Wulff et al. |
| 5,288,778 A | 2/1994 | Schmitter et al. |
| 7,104,665 B2* | 9/2006 | Kato ............... G02F 1/133603 349/69 |
| 7,922,358 B2 | 4/2011 | von Malm |
| 8,022,619 B2* | 9/2011 | Birnstock ........... H01L 51/5268 313/498 |
| 2001/0026124 A1 | 10/2001 | Liu et al. |
| 2003/0124752 A1 | 7/2003 | Wei et al. |
| 2004/0061107 A1 | 4/2004 | Duggal |
| 2005/0057176 A1 | 3/2005 | Lu et al. |
| 2005/0230678 A1* | 10/2005 | Cao et al. .................. 257/40 |
| 2006/0290272 A1 | 12/2006 | Haenichen |
| 2007/0035964 A1 | 2/2007 | Olczak |
| 2007/0126145 A1 | 6/2007 | Coyle |
| 2007/0126148 A1 | 6/2007 | Coyle et al. |
| 2007/0133101 A1 | 6/2007 | Naoi |
| 2007/0241668 A1 | 10/2007 | Ottermann et al. |
| 2008/0164807 A1 | 7/2008 | Hofmann et al. |
| 2009/0015142 A1 | 1/2009 | Potts et al. |
| 2009/0058288 A1 | 3/2009 | Bertram et al. |
| 2010/0193818 A1* | 8/2010 | Krummacher ...... H01L 51/5275 257/98 |

FOREIGN PATENT DOCUMENTS

| | | |
|---|---|---|
| CN | 101199057 | 6/2008 |
| DE | 1570 703 | 2/1970 |
| DE | 1 495 626 | 6/1971 |
| DE | 2036 052 | 1/1972 |
| DE | 2063 050 | 7/1972 |
| DE | 2232 977 | 2/1973 |
| DE | 2211 956 | 10/1973 |
| DE | 2940 024 | 4/1981 |
| DE | 3007 934 | 9/1981 |
| DE | 3334 782 | 10/1984 |
| DE | 3832 396 | 2/1990 |
| DE | 699 04 988 | 11/2003 |
| DE | 10 2004 020 245 | 12/2005 |
| DE | 10 2004 037 096 | 3/2006 |
| DE | 10 2004 041 371 | 3/2006 |
| DE | 10 2004 035 965 | 6/2006 |
| DE | 10 2006 000 993 | 7/2007 |
| DE | 10 2007 058 453 | 3/2009 |
| DE | 10 2007 054 037 | 4/2009 |
| EP | 0 026 120 | 4/1981 |
| EP | 0 026 121 | 4/1981 |
| EP | 0 026 684 | 4/1981 |
| EP | 0 028 030 | 5/1981 |
| EP | 0 039 845 | 11/1981 |
| EP | 0 079 075 | 5/1983 |
| EP | 0 091 602 | 10/1983 |
| EP | 0 097 970 | 1/1984 |
| EP | 0 110 221 | 6/1984 |
| EP | 0 110 238 | 6/1984 |
| EP | 0 146 887 | 7/1985 |
| EP | 0 156 103 | 10/1985 |
| EP | 0 234 913 | 9/1987 |
| EP | 0 240 301 | 10/1987 |
| EP | 0 269 324 | 6/1988 |
| EP | 0 500 496 | 8/1992 |
| EP | 0 517 044 | 12/1992 |
| EP | 0 634 445 | 1/1995 |
| EP | 0 969 699 | 1/2000 |
| EP | 1 406 474 | 4/2004 |
| FR | 1 561 518 | 3/1969 |
| FR | 2 859 823 | 3/2005 |
| GB | 1 122 003 | 7/1968 |
| GB | 1 229 482 | 4/1971 |
| GB | 1 367 790 | 9/1974 |
| JP | 2003 109747 | 4/2003 |
| JP | 2003-109747 | 4/2003 |
| JP | 2003-270411 | 9/2003 |
| JP | 2004-513484 | 4/2004 |
| JP | 2004-212716 | 7/2004 |
| JP | 2004 212716 | 7/2004 |
| JP | 2006-030872 | 2/2006 |
| JP | 2007-108475 | 4/2007 |
| JP | 2007-188065 | 7/2007 |
| JP | 2008-547161 | 12/2008 |
| TW | 595011 | 6/2004 |
| TW | M 342521 | 10/2008 |
| TW | 200917538 | 4/2009 |
| WO | WO 00/26275 | 5/2000 |
| WO | WO 01/05866 | 1/2001 |
| WO | WO 01/05867 | 1/2001 |
| WO | WO 02/37580 | 5/2002 |
| WO | WO 2006/012841 | 2/2006 |
| WO | WO 2007/076913 | 7/2007 |
| WO | WO 2008/014739 | 2/2008 |
| WO | WO 2009/010207 | 1/2009 |
| WO | WO2009033444 | * 3/2009 |
| WO | WO 2009/074127 | 6/2009 |
| WO | WO 2009/081750 | 7/2009 |

OTHER PUBLICATIONS

ISO-Norm 1133 (24 pages) 1997.
3M, "Optically Clear Adhesives", Technical Data, Jul. 2008, pp. 8161-9483.
3M, "Optically Clear Laminating Adhesives", pp. 8211, 8212, 8213.
Bulović, V. et al., "Weak Microcavity Effects in Organic Light-Emitting Devices", Phys. Rev. B. 58, pp. 3730-3740, 1998.
Greiner, H., "Light Extraction from Organic Light Emitting Diode Substrates: Simulation and Experiment", Japanese Journal of Applied Physics, vol. 46, No. 7A, Jul. 1, 2007, pp. 4125-4137.
Grigo, U. et al., "Polycarbonate, Polycarbonate, Polyacetale, Polyester, Celluloseester", Hanser Verlag München, Wien 1992, pp. 118-145.
Gu, G. et al., "High-External-Quantum-Efficiency Organic Light-Emitting Devices", Optics Letters vol. 22, No. 6, 396, Mar. 15, 1997.
Jordan, R. et al., "Efficiency Organic Light Emitting Diodes", Appl. Phys. Lett. 69 (14), p. 1997-1999, Sep. 30, 1996.
Legrand, D. G. et al., "Handbook of Polycarbonate Science and Technology", Marcel Dekker, New York, 2000. pp. 72ff.
Lu, M. et al., "Improved External Coupling Efficiency in Organic Light-Emitting Devices on High-Index Substrates", Int. Electron Devices Meet., Technical Digest 600, 2000.
Lupton, J. et al, "Bragg Scattering From Periodically Microstructured Light Emitting Diodes", Appl. Phys. Lett. vol. 77, No. 21, p. 3340-3342, Nov. 20, 2000.
Morgan, P.W., "Condensation Polymers by Interfacial and Solution Methods", Polymer Reviews, vol. 10, Interscience Publishers, New York, Chapter VIII, p. 325-392, 1965.
Nakamura, T. et al.: "Improvement of Coupling-out Efficiency in Organic Electroluminescent Devices by Addition of Diffusive Layer", J. Appl. Physics vol. 96, No. 11, pp. 6016-6022, Dec. 1, 2004.

(56) References Cited

OTHER PUBLICATIONS

Peng, H. et al., "Coupling Efficiency Enhancement of Organic Light Emitting Devices with Refractive Microlens Array on High Index Glass Substrate", SID 04 Int. Symp. Digest, pp. 158-161, 2004.

Salt, M. et al., "Coupling Efficiency Enhancement of Organic Light Emitting Devices with Refractive Microlens Array on High Index Glass Substrate", J. of Mod. Opt. vol. 48, 1085-1098, 2001.

Schnell, H., "Chemistry and Physics of Polycarbonates", Polymer Reviews, vol. 9, Interscience Publishers, New York, 1964 pp. 33ff, pp. 27ff, pp. 28ff, pp. 102ff.

Schnell, M. et al., "Coupling Efficiency Enhancement of Organic Light Emitting Devices with Refractive Microlens Array on High Index Glass Substrate", European Conference on Organic Electronics and Related Phenomena 2001, Proceedings, 158.

Scheffel, M. et al., "European Conference on Organic Electronics and Related Phenomena 2001 Ecoer '01", University of Potsdam, Germany, pp. 158-159, Nov. 18-21, 2001.

Shiang, J. et al., "Coupling Efficiency Enhancement of Organic Light Emitting Devices with Refractive Microlens Array on High Index Glass Substrate", J. Appl. Phys. 95, 5, p. 2880, Mar. 1, 2004.

Shiang, J. et al., "Experimental Demonstration of Increased Organic Light Emitting Device Output Via Volumetric Light Scattering", J. Appl. Phys. vol. 95, No. 5, pp. 2889-2895, Mar. 1, 2004.

Tsutsui, T. et al, "Doubling Coupling-Out Efficiency in Organic Light-Emitting Devices Using a Thin Slica Aerogel Layer", Adv. Mater Vo. 13, No. 15, pp. 1149-1152, Aug. 3, 2001.

\* cited by examiner

RADIATION EMITTING DEVICE

RELATED APPLICATIONS

This application is a U.S. National Phase Application under 35 USC 371 of International Application PCT/EP2010/058481 filed Jun. 16, 2010.

This application claims the priority of Germany application No. 10 2009 025 123.5 filed Jun. 16, 2009, the entire content of which is hereby incorporated by reference.

BACKGROUND OF THE INVENTION

The invention relates to a radiation-emitting device having a radiation decoupling layer which comprises a regular microstructure.

Radiation-emitting devices, such as e.g. OLEDs (Organic Light Emitting Diodes), typically comprise a Lambertian emission profile. However, for lighting purposes a directed emission profile which deviates from this is generally more suitable.

SUMMARY OF THE INVENTION

It is an object of the invention to provide a radiation-emitting device, the emission profile of which deviates from that of a Lambertian emitter.

A radiation-emitting device in accordance with an embodiment of the invention comprises an active layer which is formed for the production of radiation and which during operation emits a primary radiation, and a radiation decoupling layer (also referred to as radiation outcoupling layer) which is disposed on the active layer. In this case, the radiation-decoupling layer is disposed in the beam path of the primary radiation emitted by the active layer. The radiation decoupling layer comprises a side facing towards the active layer and a side remote from the active layer, wherein the remote side comprises a microstructure with regularly disposed geometric structural elements. In this case, the phrase "regularly disposed" is understood to mean that either the structural element itself comprises one or several symmetrical elements (in particular planes of symmetry) or that a structure which is formed by a multiplicity of structural elements comprises symmetrical elements (e.g. parallel shifts). The radiation decoupling layer is further characterised in that at least in partial areas it contains regions which effect scattering of the radiation (in particular the primary radiation).

The radiation produced by means of the active layer is scattered by means of the scattering regions, whereby in contrast to a device which does not have corresponding scattering regions a more homogeneous distribution of the radiated power can be achieved. Moreover, the beam progression of the radiation can be disrupted by scatter events at or in the radiation decoupling layer. This leads to an increase in the radiated power which is decoupled during operation of the component. In particular, an undesired beam progression can be disrupted in the device (which in particular can occur in the form of total reflection in the device) and the radiated power decoupled from the device can thus be increased.

By virtue of the microstructure of the side of the radiation decoupling layer which is remote from the active layer and has regularly disposed geometric structural elements, the radiation impinging upon the boundary surface undergoes refraction (in particular light refraction) on the boundary surface with respect to the surrounding medium. By reason of the fact that total reflection of the exiting radiation can be reduced or completely prevented at the boundary surface, the decoupled radiation comprises on the one hand an improved degree of efficiency and on the other hand no longer demonstrates any a Lambertian emission characteristic, wherein in particular in the case of a viewing angle of +45 to −45 degrees (in relation to the surface normal of the side or surface of the radiation decoupling layer facing the active layer) the decoupled radiation comprises an increased intensity. By suitably selecting the geometric structural elements, the intensity can be optimized for a specified viewing angle or angular range. In particular, in order to avoid intensity losses, the radiation decoupling layer and all of the surfaces of the side facing the active layer and remote from the active layer should be completely transparent.

By reason of the fact that the side of the radiation decoupling layer remote from the active layer comprises geometric structural elements, there are only a few or even no surface regions on this side which comprise surfaces which are in parallel with the side of the radiation decoupling layer facing the active layer. As a consequence, increased refraction of the decoupled radiation is effected on the boundary surface of the radiation decoupling layer and surrounding medium in the direction of the normal vector of the surface of the radiation decoupling layer facing the active layer (or of viewing angles which deviate therefrom in particular by up to 30 or up to 45 degrees). In comparison with radiation decoupling layers having irregular surface structures the radiation decoupling layers in accordance with the invention have the advantage that the surface of the radiation-emitting devices is slightly less matt. The use of a radiation decoupling layer with a combination of regions, which scatter the radiation (in-particular the primary radiation), and geometric structural elements on the side of the radiation decoupling layer remote from the active layer also has the advantage that the dependence of the emission colour upon the observation angle is reduced.

In the case of components without the radiation decoupling layer in accordance with the invention, total reflection on the surface side of the substrate remote from the active layer can cause radiation to be reflected back into the substrate and to exit e.g. at an undesired surface, e.g. a lateral surface. Moreover, reflected radiation can be absorbed in the component. Both effects serve to reduce the efficiency of the component, as less radiated power is decoupled.

In the device in accordance with an embodiment of the invention, radiation which is reflected back into the component on the boundary surface between the surrounding medium and the radiation decoupling layer is scattered on the scattering particles contained in the radiation decoupling layer, which means that the radiation is directed in such a manner that an increased proportion of radiation can be decoupled via the radiation decoupling layer. As a result, the decoupling efficiency of the radiation-emitting device is increased.

The radiation decoupling layer can also be secured subsequently to the radiation-emitting device, so that it is possible to provide only partial regions of a radiation-emitting device or only selected devices with the radiation decoupling layer. The radiation decoupling layer can thus be provided according to requirements.

In one embodiment, the radiation-emitting device is an organic light-emitting diode which comprises an active layer formed for the emission of electromagnetic radiation, and wherein the active layer comprises an organic material.

Preferably, the radiation-emitting device in accordance with the invention is formed as an organic radiation-emitting component, in particular as an organic light-emitting diode (OLED). In this case, the active layer is formed typically by means of an organic layer which contains or consists of an organic (semi)conductive material and is formed for the emission of electromagnetic radiation. The organic layer contains e.g. one or several (semi)conductive polymers and/or comprises at least one layer having a (semi)conductive molecule, in particular a low-molecular molecule ("small molecule").

An OLED which comprises the arrangement in accordance with the invention (or is prefabricated) comprises in particular electrodes for electrical contacting and optionally also an encapsulation which protects the organic layer or the organic layers and which can protect the organic layer(s) in particular from oxygen and moisture. Furthermore, at least one emitter layer is present as the organic layer. Furthermore, e.g. hole injection layers, hole transport layers, electron transport layers, barrier layers and/or blocking layers can be included.

In one embodiment, the radiation-emitting device comprises a substrate, on which the active layer (in particular the organic layer or the organic layers of the OLED) is disposed. During production of the device, e.g. the active layer, in particular the layer stack consisting of a light-emitting layer, electrodes and further layers of the OLED can be applied to the substrate. In one embodiment of the radiation-emitting device as a bottom emitter (in which a transparent substrate is used) the radiation decoupling layer is disposed typically on the side of the substrate remote from the active layer. By reason of the high mechanical stability of the substrate, the radiation decoupling layer can be mechanically stabilised by the permanent attachment of the light decoupling layer on the substrate. However, the substrate can also be formed in a flexible manner; e.g. it can consist of a synthetic material film.

The substrate can be provided over its entire surface or at least substantially over its entire surface with the radiation decoupling, layer in accordance with the invention. Typically, at least the part of the substrate which lies in the beam path (of not yet reflected or scattered) radiation emitted by the active layer is provided with the radiation decoupling layer. In particular, the radiation decoupling layer covers at least the region of the substrate which corresponds in terms of area, surface area and (horizontal) position to that of the active layer.

In one embodiment, the regions which effect refraction or scattering of the primary radiation comprise scattering particles, in particular radiation-permeable scattering particles. The scattering particles can be added in a problem-free manner to the matrix used for the radiation decoupling layer; well-defined local scatter zones can even be formed. Suitable scattering particles include both inorganic and organic particles; in particular polymer particles are to be mentioned as scattering particles.

The scattering particles serve to deflect the beam progression of radiation (e.g. the light beams) from the original direction (i.e., the direction prior to the scatter event).

In a further embodiment, the regions which effect refraction or scattering of the primary radiation comprise cavities. By virtue of these cavities, refractive index-inhomogeneities can be formed in the matrix of the radiation decoupling layer. In particular, these cavities can be gas-filled, e.g. air-filled. Particularly high refractive index differences can be formed as a result of this. In this case, scattering by means of refraction is effected primarily by reason of the comparatively high refractive index difference between the inner space and the wall of the cavity.

The said cavities can be present e.g. also in the form of hollow particles. These particles can consist in particular of radiation-permeable polymeric materials which surround a polymer-free inner space. In general, the refractive index of the polymers of the hollow particles differs from the refractive index of the matrix, in which the hollow particles are present, considerably less than the refractive index of the gas contained in the cavity differs from that of the two polymers. As a consequence, even in these particles the radiation which impinges on the hollow particle is refracted substantially by the cavity contained in the particle. Transparent layers having such cavities or hollow particles are described e.g. in US 2006/0290272. In a further embodiment, the scattering particles can comprise a core-shell construction. Typically, these particles are formed as solid particles. Through the use of such particles, almost any material can be used for the core material, since the shell can be formed from a material which is compatible both with the matrix of the radiation decoupling layer and with the core and thus the problem of a core material which is not compatible with the matrix can be eliminated. By virtue of these core-shell particles, the mechanical stability of the radiation decoupling layer can then be increased.

In one embodiment, the light-scattering regions, in particular the light-scattering particles, hollow particles and gas inclusions comprise an average diameter of 0.5 to 100 µm, in particular 2 to 20 µm. However, in individual cases average diameters of up to 120 µm are also present. Furthermore, average diameters from 2 µm to 30 µm and even from 2 µm to 50 µm are also suitable. In this case, the phrase "average diameter" is understood to mean the diameter which is determined by means of light scattering. Preferably, at least 90 percent, particularly preferably at least 95 percent, of the light-scattering regions have a diameter of more than 1 µm and less than 120 µm. Such dimensions confer to the radiation decoupling layer particularly effective diffusive properties, in particular for the scattering of visible light. For an OLED, diameters between 2 µm and 30 µm have proven in this case to be particularly suitable.

In a further embodiment, the geometric structural elements of the radiation decoupling layer comprise a substantially identical geometric shape. A microstructure having such structural elements can then be formed easily in the radiation decoupling layer. However, it is also possible for different geometric structural elements to alternate (e.g. structural elements in the manner of a ball segment and structural elements in the manner of a segment of an ellipsoid of revolution also referred to as spheroid).

In a further embodiment, the geometric structural elements of the radiation decoupling layer each have an approximately equal dimension, i.e., the volume of the structural elements is approximately equal. The volume of the structural element is considered in this case to be the part of the radiation decoupling layer which is included by the plane which is in parallel with the surface of the radiation decoupling layer which is opposite the microstructured side, and by the geometric structural element formed on the radiation decoupling layer. All of the geometric values stated hereinafter relate to a body which is characterised in this way and is contained in the microstructure. If the geometric structural elements comprise a substantially equal dimension, then it is consequently possible to produce the microstructure in a simple manner on the radiation decoupling layer.

However, it is also alternatively possible for geometric structural elements which have different dimensions to be present in the radiation decoupling layer. For example, two structural elements having different volumes can alternate (wherein e.g. the volume of the larger structural element exceeds that of the smaller structural element e.g. by at least 50 percent, e.g. in each case for structural elements in the form of a segment or an ellipsoid of revolution; such structural elements can alternate e.g. in a regular manner—it is thus possible to form a structure in which each third structural element comprises a larger volume).

By selecting geometric structural elements of a different dimension and/or geometric shape, it is possible for specific applications to reduce or even eliminate undesired effects (e.g. the superimposition of light beams in the manner of diffraction patterns or interference effects e.g. by means of periodic structures which can be produced by specific structural elements, and Moiré effects).

In one embodiment, the geometric structural elements are selected from structural elements in the manner of a ball segment, in manner of a segment of an ellipsoid of revolution, in the manner of a pyramid and in the manner of a cone or in the form of a ball segment, in the form of a segment of an ellipsoid of revolution, in the form of a pyramid and in the form of a cone and from mixtures of these structural elements. In this case, mixtures of the structural elements are to be understood to be not only the aforementioned mixtures of different structural elements, which comprise mutually different geometric shapes, but also structural elements in which (starting from a base surface in parallel with the side opposite the microstructured side) e.g. a pyramid changes into a ball segment or in which a segment of an ellipsoid of revolution changes into a cone. It is also feasible e.g. that the geometric structural element comprises the base of a pyramid, comprises in the central region the surface of an ellipsoid of revolution and comprises a cone apex at the tip. Structural elements "in the manner of a . . . " are to be understood in particular to be structural elements in which upon fleeting observation the prevailing impression is one of a ball segment, an ellipsoid of revolution segment, a pyramid or a cone, in which, however, differently configured surfaces, in particular others of the aforementioned geometric bodies, can be included.

The aforementioned geometric bodies can comprise not only highly symmetrical base surfaces. For example, the cone or the ellipsoid of revolution segment can comprise a circular or an ellipsoidal base surface. The pyramid can be in particular a regular pyramid. Furthermore, the pyramids can also have rectangular or trapezoidal base surfaces.

In one embodiment, the geometric structural elements comprise one or several planes of symmetry (i.e., mirror planes). This refers to the planes of symmetry which are perpendicular on the plane formed by the side of the radiation decoupling layer opposite the microstructured side (and the planes in parallel therewith which form the base surfaces of the symmetrical elements). Preferably, the geometric structural elements comprise at least two, typically even at least three or even at least four, such planes of symmetry. A microstructure having such structural elements can be produced in a particularly simple manner.

In one embodiment, the geometric structural element does not comprise exclusively planar but also comprises curved outer surfaces (i.e., surfaces which form boundary surfaces with the surrounding medium).

In a further embodiment, the geometric structural element comprises a shape which only approximately corresponds to that of a ball segment (a shape of this type is e.g. the shape of optical lenses). Such structural elements comprise in the region of the "optical axis" surface segments which extend almost in parallel with the base surface of the body and in which the light refraction behaviour is thus similar to that of a planar surface. The efficiency of the radiation-emitting device in accordance with the invention can be further optimised if the geometric structural elements comprise in the region of the "optical axis" of the structural element a greater curvature or comprise a type of cone apex.

In a further embodiment, the geometric structural elements take the following form: all or at least the majority of planar curves extending on the outer surface of the structural element from the maximum of the structural element (which lies in particular on the "optical axis" of the structural element) comprise a greater curvature in the region of the maximum of the structural element than in the region of the base of the structural element. In this case, planar curves (also referred to as planar trajectories) refer to the curves which extend on the outer surface of the geometric structural element, such as degrees of longitude of a globe which extend from the pole to the equator. In particular, in the upper third of the curve all of these planar curves comprise only curvatures which are greater than the curvatures in the lower third. The curvatures in the central third are generally between these curvatures.

As set out above, such geometric structural elements have the advantage that regions with a light refraction behaviour which is more likely to be unfavourable for specific applications (as they comprise larger regions which extend substantially in parallel with the base surface of the geometric body) are minimised. Moreover, these structural elements can be embossed relatively simply into a polymer melt. By reason of the rounded apex, they are not sensitive to abrasion by further films placed thereon. In contrast, radiation decoupling layers having irregular surface structures or having structural elements in the manner of a prism are sensitive to abrasion.

In one embodiment, the geometric structural elements of the microstructured surface of the radiation decoupling layer comprise a base surface which is a polygon. In this case, the term "polygon" is understood to be the mathematically correctly described, not inverted, convex, simple, planar polygon. In particular, regular polygons are to be mentioned in this case (in which all edges of the base surface are of equal length). Through the use of geometric structural element having base surfaces of this type the side of the radiation decoupling layer remote from the active layer can be provided completely (i.e., over its entire surface) with the geometric structural elements; therefore, unlike in the case of the arrangement of ball segments or cones, no planar surfaces are retained between the individual structural elements. This has the advantage already described above that for different applications undesired refractions of the beams at the boundary surface between the radiation decoupling layer and the surrounding medium can be avoided and even the total reflection, which is more likely to be undesired, on such surfaces cannot take place. The surface can be filled completely by geometric structural elements e.g. if the base surfaces of the structural elements are in each case purely similar triangles, quadrangles or hexagons, wherein in this case particular reference is to be made to the polygons having equal side lengths and equal internal angles. However, it is also feasible to use different polygons (e.g. squares in addition to rhombuses or octagons in addition to squares). In a further embodiment, the microstructure of the radiation decoupling layer is formed in such a manner that it can be embossed by means of a metal roller into a surface of the (as yet unstructured) radiation decoupling layer. It is then possible to emboss the microstructures in a particularly easy manner and unproblematically into the (as yet unstructured) radiation decoupling layer. The negatives of the structural elements can be cut into the metal roller e.g. by diamond. Embossing into the (unstructured) radiation decoupling layer can then be effected, in that after the structure has been embossed the polymeric material used for the radiation decoupling layer is cooled so rapidly that the structure is fixed on the surface. Alternatively, the structure can also be fixed by means of photochemical processes which prevent the embossed structure from flowing off. Methods and devices for thus embossing the microstructure into the surface of the radiation decoupling layer are described in US 2007/0126148 and US 2007/0126145, in this respect reference is made to these documents in their entirety.

In a further embodiment, the microstructure of the radiation decoupling layer is formed in such a manner that the maxima of mutually adjacent geometric structural elements comprise a spacing of 30 to 500 µm, in particular 100 to 250 µm, e.g. 100 to 170 µm. If the structural elements comprise several maxima (which, however, is not generally the case), then for the above definition the centre of gravity of the structural element takes the place of the maximum. In this case, the phrase "adjacent structural elements" is understood to be only the respectively direct neighbour, in particular structural elements which have common edges or whose base surfaces contact one another. In other words, in the case of the microstructures having precisely one type of geometric structural elements and having a completely symmetrical arrangement of the structural elements on the radiation decoupling side of the radiation decoupling layer the spacing of the maxima is the repetition unit.

A radiation decoupling layer having a microstructure which is formed in this manner can be embossed in a particularly simple manner—e.g. by means of a metal roller—into the (as yet unstructured) radiation decoupling layer. Particularly precise geometric structural elements are obtained if the maxima are located 20 µm or more apart from each other.

In a further embodiment, the diameter of the base of the structural element and the height of the structural element (measured between the base surface and the maximum) has a ratio of base diameter:height of approximately 1:1 to 3:1, in particular 1.5:1 to 2.5:1. Alternatively or in addition, the geometric structural elements are then formed in such a manner that in the region of the base of the structural element the structural element forms with the base surface an angle of about 50 to 70 degrees, in particular 55 to 65 degrees. In more precise terms, the radiation decoupling side of the structural element comprises on the edge formed with the base surface a tangent (which is aligned in the direction of the maximum) and which together with the base surface forms the aforementioned angle.

Structural elements which correspond to this embodiment are not only simple to produce (e.g. by means of the above-described embossing method) they also comprise a structure which guarantees particularly efficient radiation decoupling. Beams which have exited at an observation angle of about −40 to +40 degrees (in relation to the above-defined surface normal) can then generally (as long as they are decoupled) no longer impinge upon the outer surface of an adjacent structural element. The efficiency of the radiation-emitting device can thus be further improved as a result of this.

In a further embodiment, the radiation decoupling layer of the radiation-emitting device not only comprises regions, which effect scattering of the primary radiation, but also a transparent matrix. In particular, the radiation decoupling layer comprises a matrix, in which scattering particles, hollow particles or cavities are present. In particular, the matrix can consist of or can comprise a transparent polymer, e.g. a polycarbonate.

In a further embodiment, the radiation decoupling layer is adapted in terms of refractive index to the remainder of the radiation-emitting device. The exit of radiation from the device in accordance with the invention into the radiation decoupling layer is thus facilitated and the reflection losses on the boundary surface(s) with respect to the radiation decoupling layer are reduced. For the purposes of refractive index-adaptation, the refractive index of the radiation decoupling layer or, in the event that scatter zones are formed, the refractive index of the matrix material, deviates preferably by twenty percent or less, particularly preferably by ten percent or less, from the refractive index of the adjoining element of the device in accordance with the invention (i.e., in particular the refractive index of the substrate). In order to adapt the refractive index to a glass substrate, e.g. a polycarbonate is particularly suitable for the radiation decoupling layer. Alternatively or in addition, it is possible to use a refractive index-adapting material, e.g. an optical gel for refractive index-adaptation, which is disposed between the radiation decoupling layer and the substrate. This material then reduces the sudden refractive index change between the substrate and the radiation decoupling layer.

In a further embodiment, the radiation decoupling layer is attached, in particular in a firmly bonded manner, to the underlying layer of the device in accordance with the invention. For example, the radiation decoupling layer can be attached to, e.g. laminated onto, an underlying substrate of the device in accordance with the invention by means of an adhesion promoter. In this case, the adhesion promoter can also be used as a refractive index-adapting material.

In a further embodiment, the radiation decoupling layer comprises a thickness of at least 10 µm. In particular, the radiation decoupling layer can be of a thickness of 25 µm to 500 µm, typically of 50 µm to 300 µm. The radiation decoupling layer frequently comprises a thickness of greater than 70 µm.

The radiation decoupling layer can be formed in one piece; however, it can also consist of a layer composite. In particular, the radiation decoupling layer can comprise two partial layers, wherein one layer contains regions which effect scattering of radiation or this layer consists entirely of such regions, wherein the partial layer is in particular a matrix having scattering particles, hollow particles or gas inclusions distributed therein homogeneously (i.e. statistically), and the other partial layer does not comprise any such regions, particles or gas inclusions. In general, this type of two-layered construction will comprise the partial layer without any light-refracting or light-scattering regions on the radiation decoupling side, i.e., in the region of the geometric structural elements, and will comprise the partial layer with light-scattering regions between this layer and a substrate disposed e.g. therebelow.

This type of two-layered or multiple-layered radiation decoupling layer can be produced e.g. by means of coextrusion, wherein the at least two partial layers are produced by means of at least two extruders, wherein the respective synthetic material melts are brought together in the die lip.

In a further embodiment, the radiation decoupling layer can also consist of two partial layers, in which the partial layer on the radiation decoupling side is formed from a material which is particularly well suited for an embossing method (e.g. as described above). The partial layer present on the radiation decoupling side can contain light-scattering regions, but in general no such regions will be present. The underlying partial layer facing the active layer will generally consist of a material, into which the light-refracting or light-scattering regions can be introduced in a particularly effective manner. This material will frequently also be adapted in terms of refractive index to the underlying layer, in particular to the substrate of the device in accordance with the invention.

In order to ensure a particularly effective embossing capability, the partial layer present on the radiation decoupling side can consist of a material having a relative solution viscosity of 1.1 to 1.4, in particular 1.15 to 1.3, as measured by means of an Ubbelohde viscosimeter. Alternatively or in addition, the material can have an MVR value (300° C., 1.2 kg) of 1 to 100 cm$^3$/10 min, preferably 3 to 80 cm$^3$/10 min, as measured by means of the ISO Standard 1133. Materials which satisfy these specifications are e.g. PMMA (poly(methyl methacrylate)) or specific polycarbonates (e.g. Makrolon OD 2015, Bayer Material Science AG). Partial layers consisting of such materials can frequently be coextruded in a problem-free manner with a further (non-embossed) partial layer consisting of different materials. For example, two partial layers consisting of polycarbonate or of PMMA demonstrate excellent adhesion to one another.

Possible further transparent polymers, which are used for this purpose, are the following thermoplastic synthetic materials: amorphous polyamides, polycarbonates or copolycarbonates based on diphenols, poly- or copolyacrylates and poly- or copolymethacrylates such as e.g. and preferably poly(methyl methacrylate) (PMMA), poly- or copolymers with styrene such as e.g. and preferably polystyrene (PS) or polystyrene acrylonitrile (SAN), thermoplastic polyurethanes, and polyolefins, such as e.g. and preferably polypropylene types or polyolefins based on cyclic olefins (e.g. TOPAS®, Hoechst), poly- or copolycondensates of terephthalic acid, such as e.g. and preferably poly- or copolyethylene terephthalate (PET or CoPET), glycol-modified PET (PETG), glycol-modified poly- or copolycyclohexane dimethylene terephthalate (PCTG) or poly- or copolybutylene terephthalate (PBT or CoPBT), poly- or copolycondensates of naphthalene dicarboxylic acid, such as e.g. and preferably polyethylene glycol naphthalate (PEN), poly- or copolycondensate(s) of at least one cycloalkyl dicarboxylic acid, such as e.g. and preferably polycyclohexane dimethanol cyclohexane dicarboxylic acid (PCCD), polysulfones (PSU) or mixtures thereof.

For embodiments, in which a spacing between the two partial layers is desired; particular consideration is given to the following material combinations, in which the two partial layers comprise a relatively low adhesive force: polycarbonate/cyclic olefins, polycarbonate/amorphous polyamides, polycarbonate/poly- or copolyethylene terephthalate (PET).

In a further embodiment, the radiation decoupling layer comprises at least two mutually spaced apart partial layers, wherein provided between the partial layers is a medium which comprises a lower refractive index than the two adjoining partial layers. In particular, the refractive index of the medium should be at least fifteen percent lower than the refractive index of the partial layer having the lower refractive index. The boundary surfaces of the two said partial layers which adjoin this separating medium extend substantially in parallel with one another; typically, these boundary surfaces also extend substantially in parallel with the surface, facing the radiation-emitting functional layer, of the radiation decoupling layer (which for its part extends mostly substantially in parallel with the surface, facing the radiation decoupling layer, of the substrate or of another layer, to which the radiation decoupling layer is directly applied). Frequently, in the case of this type of embodiment the partial layer which contains the geometric structural elements will not contain any regions, in which light refraction is effected; however, it can be expedient e.g. for production-related reasons to design both partial layers from the same material, so that such regions can be present in both partial layers. Furthermore, the two partial layers of this embodiment can consist of different or identical matrix materials or mixtures of matrix materials (which optionally contain the regions, in which light refraction or light scattering is effected). Different materials can be particularly expedient if—as already stated above—produc- tion-related aspects with regard to the production of the geometric structural elements or the requirement of adapted refractive indices play a role.

An embodiment of this type has the advantage that beams which impinge upon the boundary surface between the partial layer, which is located in closer proximity to the active layer, and the spacing medium at a shallow angle is reflected back, by means of total reflection, into this partial layer (which also contains the light-scattering regions). Therefore, only beams which form a relatively large angle with the boundary surface with respect to the spacing medium enter the partial layer which comprises a microstructure. This again ensures that it is possible to increase the proportion of beams which are emitted in the direction of the surface normals with respect to this boundary surface or at observation angles between −45 and +45 degrees, in particular −30 and +30 degrees. The proportion of radiation which is decoupled in the direction of the surface normals or at observation angles between −45 and +45 degrees, in particular −30 and +30 degrees can be increased once again if the geometric structural elements specifically mentioned above are provided as a microstructure, in particular if the radiation decoupling side of the radiation decoupling layer is provided over its entire surface with structural elements, and/or geometric structural elements are used whose surface comprises different curvatures as described above.

The refractive medium between the spaced-apart partial surfaces can be a liquid or a gas. The gas can be in particular air, nitrogen or a noble gas. In order to be able to adjust, in the most effective manner possible, a total reflection of beams which impinge at low angles upon the boundary surface with respect to the spacing medium, the refractive index of the partial layer located in closer proximity to the active layer should be as high as possible.

In particular, the refractive index should be greater than or equal to 1.4, preferably greater than or equal to 1.48 and particularly preferably greater than or equal to 1.55. The matrix of this partial layer can consist of, or contain, e.g. polycarbonate. The partial layer which contains the microstructure should also comprise a refractive index which is as high as possible; however, this layer should also be formed from a material, into which a microstructure can be introduced in a particularly effective manner. This layer can consist of, or contain, e.g. PMMA.

Radiation which is totally reflected at the boundary surface between the partial layer, which is located in closer proximity to the active layer, and the spacing medium can be deflected in the direction of this boundary surface by means of scatter in the light-scattering regions, until no more total reflection occurs and the radiation impinges at a relatively sharp angle upon the boundary surface. As a consequence, the radiation which is decoupled from the radiation decoupling layer in the direction of the surface normals or at observation angles between −45 and +45 degrees, in particular −30 and +30 degrees, can be increased considerably.

The spacing between the two spaced-apart partial layers of the radiation decoupling layer is typically a maximum of 50 µm; in most cases, the spacing is also at least 0.5 µm. In order to minimise the thickness of the radiation-emitting device, the smallest possible spacings are expedient. In the case of smaller spacings, improved cohesion of the entire device and in particular of the two partial layers and therefore improved mechanical stability are generally also observed.

The two partial layers of the light-decoupling layer can be spaced apart e.g. by virtue of the fact that point-shaped drops of an adhesive (in particular a transparent adhesive) are applied at regular (or even irregular) spaced intervals to the first partial layer, and a connection with the second partial layer of the radiation decoupling layer is then established via these points of adhesive. Alternatively, in order to adjust the spacing, a different support structure, in particular a support structure consisting of a transparent material, can also be disposed between the two partial layers. In this case, it is possible to use any material, in particular any transparent material. A firmly bonded connection of the two partial layers does not have to be established via the support structure or can be established e.g. only partially via the support structure. It is essential that the proportion of mutually facing surfaces of the two partial layers is covered by the support structure to the least possible extent. Support structures which on the one hand guarantee uniform spacing over all of the mutually facing surfaces of the partial layers but on the other hand take up as little space as possible are thus advantageous. For example, the support structure can be present in the edge regions (e.g. in the form of a line of adhesive). Furthermore, the support structure can consist in the fact that the partial layer which contains the geometric structural elements, and the layer sequence of the functional layers having the second layer disposed thereon are clamped into a frame. Finally, the boundary surface of the partial layer which faces the second partial layer and contains the geometric structural elements can also be intentionally selected such that this boundary surface has a texture thereon which permits formation of the spacing arrangement.

The thickness of a radiation decoupling layer, in which mutually spaced-apart partial layers are present, does not differ from the values stated above for a radiation decoupling layer without spaced-apart partial layers.

In a further embodiment, the radiation-emitting device contains an element which absorbs ultraviolet radiation (UV). The UV-absorbing element can consist of a UV-protective layer which can be disposed e.g. on the side of a substrate facing the radiation decoupling layer. However, it can also be contained in a film composite with the radiation decoupling layer and can be disposed e.g. between two partial layers of the radiation decoupling layer or between a partial layer and the spacing medium or else also on the side of the radiation decoupling layer facing the active layer. Furthermore, the radiation decoupling layer itself can be formed by the addition of one or several additives which act in such a manner as to absorb UV. The matrix which is used for the radiation decoupling layer can be formed so as to absorb UV.

As the additive which acts in such a manner as to absorb UV, it is possible to add e.g. 0.01 to 0.5 wt. % of a UV-absorber selected from the classes of benzotriazoles, triazines and diaryl cyanoacrylates to the matrix used for the radiation decoupling layer or a partial layer.

A UV-absorbing material has the advantage that in the case of OLEDs the organic layer provided for the production of radiation cannot be damaged by UV-radiation, which can lead to an accelerated failure of the component.

At the very least, ageing can be slowed down by the UV-absorbing materials.

The radiation decoupling layer or the partial layers of the radiation decoupling layer or of the film composite which forms the radiation decoupling layer can additionally contain processing aids. In particular, demoulding agents, flow agents, stabilisers such as thermostabilisers, antistatic agents and/or optical brighteners can be contained.

Suitable stabilisers are e.g. phosphines, phosphites or Si-containing stabilisers and further compounds described in EP-A 0 500 496. By way of example, reference can be made to triphenylphosphites, diphenyl alkyl phosphites, phenyl dialkyl phosphites, tris-(nonylphenyl)phosphite, tetrakis-(2, 4-di-tert.-butylphenyl)-4,4'-biphenylene-diphosphonite, bis (2,4-dicumylphenyl)pentaerythritol diphosphite and triaryl phosphite. Triphenyl phosphine and tris-(2,4-ditert.-butylphenyl)phosphite are particularly preferred.

Suitable demoulding agents are e.g. the esters or partial esters of monovalent to hexavalent alcohols, in particular of glycerol, pentaerythritol or of Guerbet alcohols.

Monovalent alcohols are e.g. stearyl alcohol, palmityl alcohol and Guerbet alcohols, a divalent alcohol is e.g. glycol, a trivalent alcohol is e.g. glycerol, tetravalent alcohols are e.g. pentaerythritol and mesoerythritol, pentavalent alcohols are e.g. arabitol, ribitol and xylitol, hexavalent alcohols are e.g. mannitol, glucitol (sorbitol) and dulcitol.

The esters are preferably the mono-esters, di-esters, tri-esters, tetra-esters, penta-esters and hexa-esters or mixtures thereof, in particular statistical mixtures, consisting of saturated, aliphatic $C_{10}$ to $C_{36}$ monocarboxylic acids and optionally hydroxy monocarboxylic acids, preferably with saturated, aliphatic $C_{14}$ to $C_{32}$ monocarboxylic acids and optionally hydroxy monocarboxylic acids.

The commercially available fatty acid esters, in particular of pentaerythritol and of glycerol, can be produced to contain less than 60% of different partial esters.

Saturated, aliphatic monocarboxylic acids with 10 to 36 C-atoms are e.g. capric acid, Lauric acid, myristic acid, palmitic acid, stearic acid, hydroxy stearic acid, arachidic acid, behenic acid, Lignoceric acid, cerotinic acid and montanic acids.

Provided with the component in accordance with the invention in a further embodiment is an antistatic element which is disposed in particular on the radiation decoupling side of the radiation decoupling layer. As a consequence, it is possible to reduce agglomerations of dirt on the component. It is particularly advantageous to form the radiation decoupling layer or the partial layer, which contains the microstructure, so as to be antistatic. Electrostatically caused agglomerations on the radiation decoupling layer which can have an adverse effect upon the exit-side radiated power distribution are reduced in this manner.

Examples of suitable antistatic agents are cation-active compounds, e.g. quartenary ammonium, phosphonium or sulfonium salts, anion-active compounds, e.g. alkyl sulfonates, alkyl sulfates, alkyl phosphates, carboxylates in the form of alkali- or alkaline earth metal salts, non-ionogenic compounds, e.g. polyethylene glycol esters, polyethylene glycol ethers, fatty acid esters, ethoxylated fatty amines. Preferred antistatic agents are quartenary ammonium compounds, such as e.g. dimethyl diisopropyl ammonium perfluoro butane sulfonate.

In a further embodiment, another protective layer is disposed on the microstructured side of the radiation decoupling layer. The protective layer can formed in particular in a planar manner (and comprises preferably two plane-parallel main surfaces) and has the effect of preventing the radiation-emitting device, in particular the intermediate spaces between the elevations of the geometric structural elements, from becoming dirty, and it is thus possible to achieve a high degree of stability in the efficiency of the radiation decoupling from the radiation-emitting device. Moreover, the protective layer exerts a protective action with respect to mechanical loads, such as e.g. scratching. The protective layer can have e.g. a thickness of 10 to 1000 μm, which means that the entire radiation-emitting device can have a thin design.

Just like the substrate, the protective layer can be formed from a material which is selected from the group of glass, quartz, synthetic material and synthetic material with diffusion barrier layers and metal. This permits a solution for the substrate and/or the protective layer which is stable, easy to produce and cost-effective.

In a further embodiment, the radiation-emitting device, in particular the OLED, is provided for lighting purposes, in particular lighting over a large area. The device is then formed in particular as a flat surface. The phrase "formed as a flat surface" can mean that the radiation-emitting device extends contiguously over a surface area which comprises at least an area of one or several square millimeters, typically one or several square centimeters and frequently one or several square decimeters (e.g. two to ten square decimeters). It is thus possible to produce very flat radiation-emitting devices for lighting over a large area.

Radiation-emitting devices, in which at observation angles between −30 and +30 degrees (in relation to the direction of the surface normal) the decoupled radiation is increased, in particular considerably increased, compared to that of a Lambertian emitter, are particularly suitable as light or radiation sources which are disposed relatively far away from the object which is to be irradiated (e.g. as ceiling lights in rooms). Radiation-emitting devices, in which even at observation angles between −30 and −45 degrees or between +30 and +45 degrees (in relation to the direction of the surface normal) the decoupled radiation is increased, in particular considerably increased, compared to that of a Lambertian emitter, are particularly suitable as light or radiation sources which are disposed relatively close to the object which is to be irradiated (such as task lights e.g. for workstation or dining table lighting).

BRIEF DESCRIPTION OF THE DRAWINGS

On the whole, the radiation-emitting device in accordance with the invention having a radiation decoupling layer provides a great number of advantages which are set in the foregoing and hereinafter. Further features, advantages and expedient features of the invention are apparent from the following description of exemplified embodiments in conjunction with the Figures, in which:

FIGS. 4 and 4A show a sectional view of an embodiment of a radiation decoupling layer of the component in accordance with the invention.

Like elements, similar elements and elements which have an identical effect are designated by like reference numerals in the Figures.

DETAILED DESCRIPTION OF THE DRAWINGS

Figure 1:
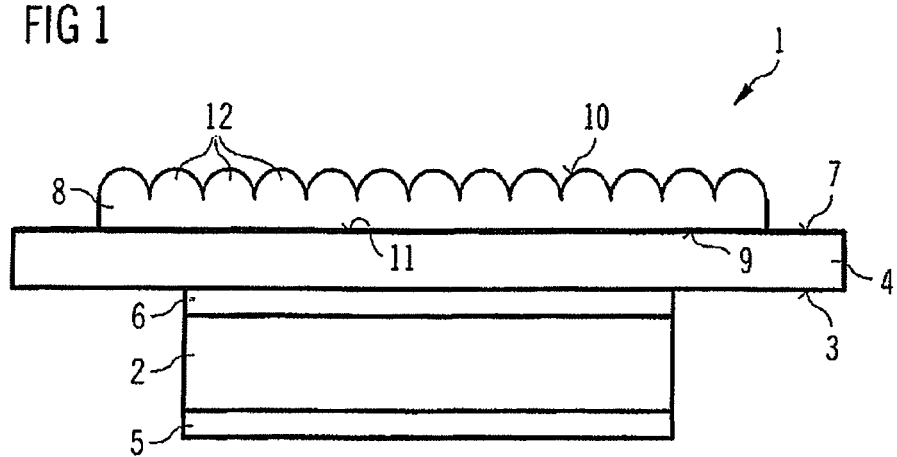
FIG. 1 shows an exemplified embodiment of a radiation-emitting device in accordance with the invention in a schematic sectional view.

FIG. 1 illustrates an exemplified embodiment of a radiation-emitting component in accordance with the invention in a schematic sectional view. The radiation-emitting component 1 is designed in each case as an OLED. The component 1 comprises an organic layer 2 formed for the production of radiation, or a corresponding layer stack having a plurality of organic layers. The organic layer 2 is disposed on a first main surface 3 of a substrate 4 of the radiation-emitting component and is connected thereto.

For the purpose of charge carrier injection into the organic layer 2, said layer is connected in an electrically conductive manner to a first electrode 5, e.g. the cathode, and to a second electrode 6, e.g. the anode. Charge carriers—electrons or holes—can be supplied via these electrodes 5, 6 to the organic layer for the production of radiation by recombination in the organic layer 2. The electrodes 5 and 6 are formed preferably in layered fashion, wherein in a particularly preferred manner the organic layer is disposed between the electrodes. The electrodes and the organic layer 2 can be applied to the first main surface 3 of the substrate.

The organic layer or the organic layers preferably contain a semiconductive organic material. For example, the organic layer contains a semiconductive polymer. Suitable organic or organometallic polymers comprise: polyfluorenes, polythiopenes, polyphenylenes, polythiophenylnylenes, poly-p-phenylenvinylenes, polyspiro polymers and their families, copolymers, derivatives and mixtures thereof.

Alternatively or in addition to polymer materials, the organic layer can contain a low-molecular material (so-called small molecules). Suitable materials having a low molecular weight (low-molecular materials) are e.g. tris-8-aluminium-quinolinol-complexes, Irppy (tris(2-phenylpyridyl) iridium-complexes) and/or DPVBI (4,4'-bis(2,2-diphenyl-ethene-1-yl)-diphenyl).

The substrate 4 is formed so as to be radiation-permeable to radiation produced in the organic layer 2. Preferably visible light is produced by means of the organic layer 2. For example, the radiation-permeable substrate used is a glass substrate, e.g. consisting of borofloat glass, or a synthetic material-(film) substrate, e.g. consisting of PMMA (polymethylmethacrylate).

Light which passes through the second main surface 7 of the substrate 4 remote from the organic layer 2 can decouple from the component 1. In particular, the radiation exit surface of the component can be formed by means of the second main surface 7. Furthermore, on the side of the organic layer 2 remote from the substrate 4 a reflective layer can be disposed. It reflects radiation—extending in the organic layer away from the substrate—back preferably in the direction of the substrate 4. The radiated power which during operation of the component exits via the radiation exit surface can thus be increased. Preferably, the first electrode 5 is formed as a reflective electrode and thus at the same time as a reflective layer. For this purpose, the electrode 5 is formed preferably from metal or on an alloy-basis. A separate reflective layer is not shown explicitly in the Figures.

The electrode 5 can optionally be designed as a multiple-layered structure. Preferably, one of the layers is formed for the charge carrier injection into the organic layer 2 and a further layer of the electrode is formed as a reflective layer. In an expedient manner, the layer for the charge carrier injection is disposed between the reflective layer and the organic layer. The reflective layer and/or the charge carrier injection layer can contain, or consist of, a metal, e.g. Au, Al, Ag or Pt, wherein the two layers expediently contain different metals. An alloy, preferably having at least one of the aforementioned metals, is optionally also suitable for the (multiple-layer) electrode 5.

The second electrode 6 is disposed between the substrate 4 and the organic layer 2. For the passage of radiation, this electrode is formed in an expedient manner to be radiation-permeable. For example, the electrode contains a TCOi. Transparent conductive oxides ("TCO" for short) are transparent conductive materials, in general metal oxides, such as e.g. zinc oxide, tin oxide, cadmium oxide, titanium oxide, indium oxide or indium tin oxide (ITO). In addition to binary metal oxygen compounds, such as e.g. ZnO, $SnO_2$ or $In_2O_3$, ternary metal oxygen compounds, such as e.g. $Zn_2SnO_4$, CdSnO3, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p-doped or n-doped.

A radiation decoupling layer 8 is attached to the substrate on the radiation decoupling side of the component 1, i.e. the side of the substrate 4 remote from the organic layer 2. The radiation decoupling layer 8 comprises a side 9 facing the active layer (or the organic layer 2), and a side having a microstructured surface 10. On the side having a microstructured surface 10, the radiation decoupling layer 8 comprises a microstructure having geometric structural elements 12.

For reasons of clarity, an encapsulation for the organic layer 2, which is disposed preferably on the side of the substrate 4 remote from the radiation decoupling layer 8, has not been illustrated. Likewise, an optionally included protective layer for the radiation decoupling layer has also not been illustrated for reasons of clarity. An encapsulation encapsulates the organic layer from detrimental external influences, such as moisture or oxygen. The encapsulation can be formed e.g. as a roof construction.

The electrical contacting of the component is also not illustrated explicitly. Therefore, e.g. a trigger circuit of the component can be disposed on the substrate—likewise within the encapsulation.

The component can optionally also comprise a plurality of preferably structured, mutually separate organic layers or layer stacks. The different layers or layer stacks can be formed to produce light of different colours, e.g. red, green or blue light.

Located between the radiation decoupling layer 8 and the substrate 4 can be a layer (not illustrated) which can be e.g. an adhesion promoting layer, e.g. an adhesive layer. For this purpose, "optically clear laminating adhesive #8141" from 3M can be used.

The radiated power which during operation is decoupled from the composite component illustrated in FIG. 1 can be increased via the radiation decoupling layer 8. By virtue of the microstructure of the radiation decoupling layer 8, the decoupled light is refracted to an increased extent on the boundary surface of the radiation decoupling layer and the surrounding medium (i.e. on the microstructured surface 10) in the direction of the normal vector of the surface 9 of the radiation decoupling layer 8.

In comparison with a radiation decoupling layer which does not contain any scattering regions, scatter events in the scattering regions of the radiation decoupling layer can cause the beam progression to be disrupted by statistical beam deflections. In particular, the angles at which radiation impinges upon the microstructured surface of the radiation decoupling layer can be more broadly distributed.

Furthermore, the radiated power distribution on the radiation decoupling side of the component can be homogenised in a simplified manner by means of the radiation decoupling layer. For example, a defective region of the organic layer which in the absence of a radiation decoupling layer (with scatter regions) would appear on the radiation decoupling side as a dark region would be compensated for via diffuse light scattering by means of the radiation decoupling layer or the regions contained therein. A radiation decoupling layer 8 can be attached to the respective components found to be suitable, since a large number of components were tested as it were in relation to functionality or adequate radiated power and unsuitable components were rejected. In contrast to a control element which is already integrated in the respective components during manufacture, the production costs can thus be reduced on account of the reduced number of rejects.

The component 1 is formed preferably for lighting purposes, in particular for general lighting purposes. In contrast to a use in displays, in which the definition must be preserved between the individual pixels, a light decoupling layer having scatter regions, which in displays would cause blurring of the individual pixels, can be used in components for the purpose of general lighting without any significant adverse effect. The component can be used e.g. for interior lighting, exterior lighting or in a signal light.

The component is formed, in particular for use in general illumination, in an expedient manner for producing visible radiation. The decoupling-side light density, the decoupling-side luminous emittance and/or the decoupling-side brightness can be considerably increased via the light decoupling layer.

Figure 2:
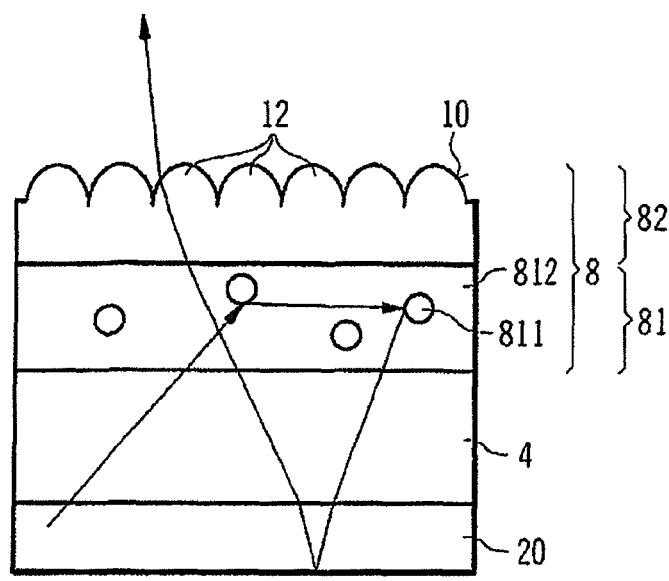
FIG. 2 shows an exemplified embodiment of a radiation-emitting component in accordance with the invention with the illustrated progression of radiation.
Figure 3:
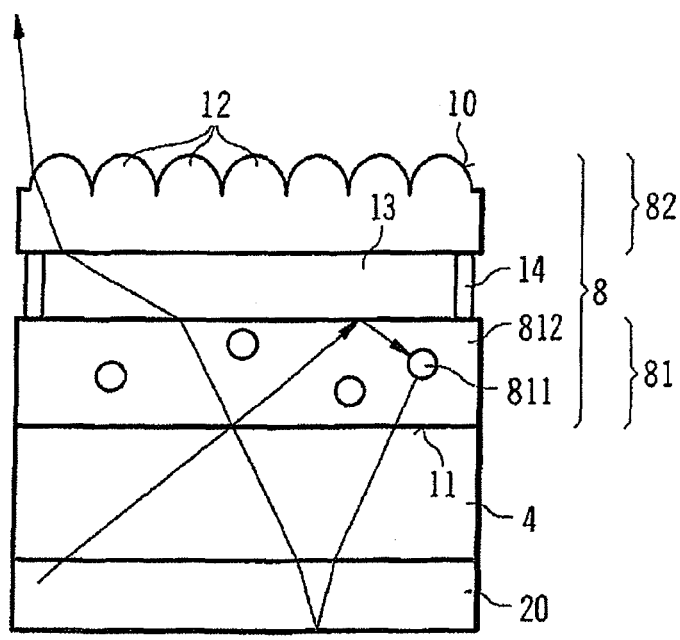
FIG. 3 shows a further exemplified embodiment of the radiation-emitting device in accordance with the invention with the plotted beam progression.

FIGS. 2 and 3 each show an exemplified embodiment of an OLED with the progression of emitted partial beams.

In the exemplified embodiments in accordance with FIGS. 2 and 3, the light decoupling layer 8 comprises a partial layer 81 mixed with scattering particles 811. The scattering particles 811 are present in a matrix 812 which is preferably formed from a radiation-permeable polymer, e.g., polycarbonate. Organic polymer particles are particularly suitable as scattering particles. Furthermore, the light decoupling layer 8 comprises a partial layer 82 provided with a microstructured surface 10. A substrate 4 is disposed adjacent to the partial layer 81. An OLED stack 20 is disposed adjacent to the substrate side remote from the radiation decoupling layer 8; the organic layers and electrodes described above are not illustrated in these Figures.

Furthermore, the scattering particles 811 are preferably formed to be permeable to radiation. For a scattering effect, the scattering particles expediently comprise a refractive index which is different from the refractive index of the matrix material 812. By means of radiation-permeable scattering particles, a scattering effect can thus be achieved by reflection at the boundary surface to the film matrix and/or by refraction upon entry in, upon passage through and/or upon exit from the scattering particle.

The scattering particles can be admixed in a statistical distribution to a moulding composition for the matrix material prior to the production of the light decoupling layer 8. The proportion of scattering particles in the scattering film is preferably 50 wt. % or less.

The refractive index of the scattering particles differs form the refractive index of the matrix material preferably by 0.6% or more, particularly preferably by 3.0% or more and particularly advantageously by 6% or more. The greater the deviation, the more efficient is, in general, the beam deviation by means of the scattering particles.

Polymer hollow particles are, for example, suitable for the scattering particles, wherein scattering by way of refraction occurs mainly owing to the comparatively high refractive index difference between the hollow body interior and the hollow body wall. If polymer materials are used for the matrix 812 and also for the surrounding wall of the cavity of the hollow particle, then these generally have a comparatively low refractive index difference. The refractive index difference between the material of the surrounding wall and the interior, which can be filled e.g., with gas, for instance air, can be formed to be comparatively larger than this in a simplified manner. Instead of the hollow particles described above, radiation-permeable solid particles, in particular polymer particles which are substantially free of cavities, can of course be used. In one embodiment, polymer particles have a core-shell morphology. Furthermore, the scattering particles can also consist of an inorganic material, in particular an inorganic material with a high refractive index, in particular a refractive index which is at least 10% greater than that of the matrix material. For instance, titanium dioxide with a refractive index of 2.6 and aluminium oxide with a refractive index of 1.77 can be cited as examples.

The partial layer 82 of the radiation decoupling layer 8 lying further remote from the substrate comprise geometric structural elements 12 on the radiation decoupling side 10. By means of these geometric structural elements, the emitted radiation can be aligned in the direction of certain viewing angles, in particular aligned in the direction of the normal vector lying perpendicular to the surfaces of the substrate lying substantially in parallel with each other and with the side of the radiation decoupling layer facing the substrate. The geometry of the geometric structural elements 12 shown in FIG. 4 is, for example, suitable for the microstructure.

Figure 4:
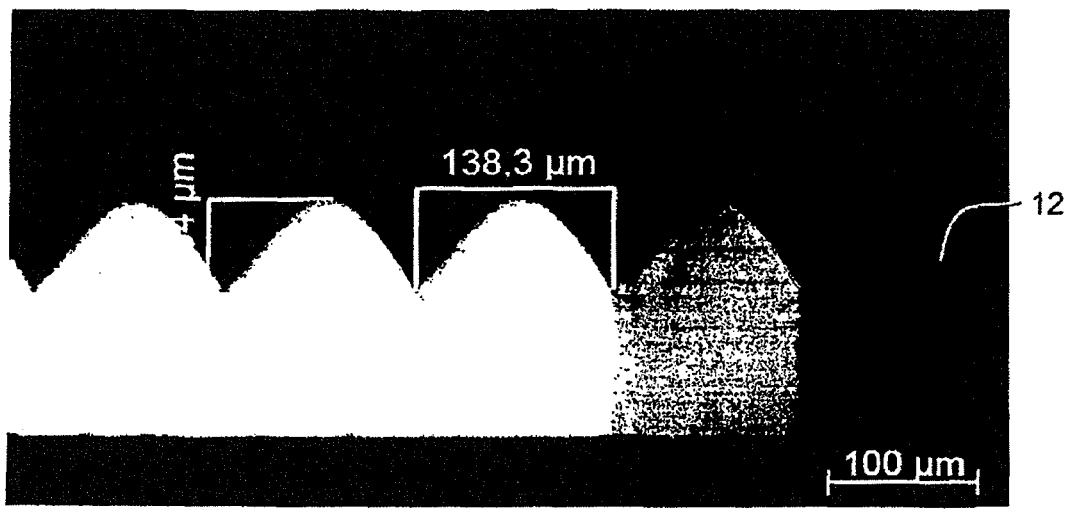
Figure 4:
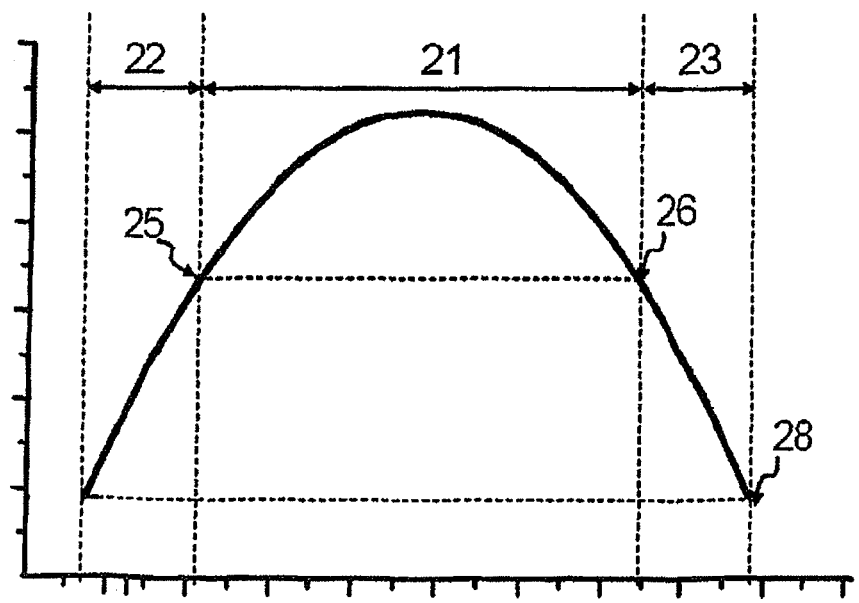

FIG. 4 shows a photograph taken using an optical microscope of a (cross-)section through an embodiment of a radiation decoupling layer of the component in accordance with the invention. FIG. 4A shows that in the region of the base the geometric structural elements 12 comprise an incline which forms an angle of approximately 60° with the corresponding incline of the base of an adjacent structural element. Furthermore, in their upper third the geometric structural elements have a clearly greater curvature than in their lower third.

The structural element shown in FIG. 4 is described in more general terms in the following exemplary embodiment: in this exemplary embodiment, a geometric structural element is chosen in which the light decoupling surface of the structural element is determined mathematically. For the mathematical determination, the determining parameters are the two acceptance angles—which are mostly identical in this case—and the reduction factor. The structural element or its light decoupling surface is designed in accordance with the following procedure using the cited formulae. The described procedure is an implicit optimisation problem:

a) calculating the aperture angle in the medium $\theta_1$ and $\theta_2$ from the Fresnel equations using the defined acceptance angles;

b) designing the two parabolic branches $P_1$ (22) with the aperture angles in the medium $\theta_1$ and $P_2$ (23) with the aperture angles in the medium $\theta_2$ in accordance with the equation:

$$y_{1,2} = \frac{(x \mp \cos\theta_{1,2})^2}{2(1 \mp \sin\theta_{1,2})} - \frac{1 \pm \sin\theta_{1,2}}{2}$$

wherein $\theta_{1,2}$ is the aperture angle in the medium of the left ($\theta_1$) and right ($\theta_2$) parabola, x is the x-coordinate and $y_{1,2}$ is the y-coordinate of the left ($y_1$) and right ($y_2$) parabola;

c) calculating the end points of the parabolic branches $F_1$, $F_2$ (25, 26) and $E_1$, $E_2$;

d) rotating the parabolic branch $P_1$ about the aperture angle in the medium $-\theta_1$ and the parabolic branch $P_2$ about the aperture angle in the medium $\theta_2$ and translating the parabolic branch $P_2$ along the x-axis;

e) optionally in the case of an asymmetric variation with $\theta_1 \neq \theta_2$, determining the inclination of the inclined surface determined by the points $E_1$ and $E_2$;

f) determining the effective acceptance angle in air from the geometry designed in steps a) to e);

g) comparing the effective acceptance angles with the defined acceptance angles, and if there is insufficient accuracy (in particular a deviation of more than 0.001%), repeating steps a) to f) with corrected acceptance angles instead of the defined acceptance angles in step a), wherein the corrected acceptance angles are not identical to the defined acceptance angles, and wherein the corrected acceptance angles are chosen such that the effective acceptance angles from step f) coincide with the defined acceptance angles; and h) when there is sufficient accuracy (in particular a deviation of the effective acceptance angles from the defined acceptance angles of 0.001% or less), reducing the parabolas in the y-direction to the extent determined by the reduction factor with the new end points $E_3$ and $E_4$ (27 and 28).

i) optionally: replacing the edge delimited by the points $F_1$ and $F_2$ (25, 26) by an $n^{th}$ order polynomial (21) which is affiliated in a continuously differentiable manner.

In particular, the geometric structural element of this embodiment is characterised in that the defined acceptance angle $\theta_1$ is between 5° and 60° and in that the defined acceptance angle $\theta_2$ is between 5° and 60°.

The geometric structural element of this embodiment can be characterised in that in step h) the reduction is simple truncation.

The geometric structural element of this embodiment can be characterised in that in step h) the reduction is a compression of the geometry along the y-axis by the factor determined by the reduction factor.

The geometric structural element of this embodiment can be characterised in that $\theta_1 = \theta_2$.

The geometric structural element of this embodiment can be characterised in that the light decoupling surface of the structural element has a continuously polynomial closure, which, for example, is an $n^{th}$ order polynomial, in particular a fourth order polynomial which is continuously differentiable in the points $F_1$ and $F_2$.

The geometric structural element of this embodiment can be characterised in that the light decoupling surface of the structural element has a continuous closure which can be described by a parabola, hyperbola, circle function, sinusoidal function or straight line.

The geometric structural element of this embodiment can finally also be characterised in that the overall period is in a range between 10 μm and 1 mm, preferably 30 μm-500 μm, particularly preferably 50 μm 300 μm.

The structural element shown in FIG. 4 or 4A can have for example the following parameters: acceptance angle: 40°, reduction factor: 0,1, polymer: polycarbonate, polynomial range (21): $2^{nd}$ order polynomial.

FIG. 3 shows the same structure as FIG. 2, but the device comprises a gap 13 filled with a spacing medium, in particular a gaseous spacing medium, between the partial layer 82 containing the microstructured surface 10 and the partial layer 81 containing the light scattering particles 811. The substantially parallel progression of the mutually facing sides of the partial layers 81 and 82 or the substantially identical spaced disposition of the two partial layers over the entire surface can be achieved by means of a support structure 14. Owing to an arrangement with a gap 13, the progression of radiation, which in FIG. 2 impinges upon the boundary surface to the partial layer 82 at a shallow angle, would change considerably. As can be seen in FIG. 3, such beams are totally reflected at the boundary surface to the spacing medium and then directed by the scattering particles or a mirrored layer in the region of the OLED 20 at a steeper angle in the direction of the boundary surface to the spacing medium. Owing to the geometric structural elements contained in the partial layer 82, this beam is then deflected approximately in the direction of the normal vector described above.

The arrows in FIGS. 2 and 3 symbolise in an exemplary manner beam paths in the radiation decoupling layer 8 and the component in accordance with the invention, wherein in the case of the partial layers provided with the scattering particles 811, an illustration of the passage or radiation through the particles has not been provided for reasons of clarity.

The radiation decoupling layer 8 has in particular a thickness between 25 µm and 500 µm and is typically between 25 µm and 300 µm. These thickness measurements also include the geometric structural elements and are particularly suitable on the one hand with respect to the scattering effect and on the other hand with respect to an increase in the overall mechanical stability of the composite component. In particular, by way of a radiation decoupling layer which is subsequently attached to a prefabricated component the stability of the component can still be ensured even in the case of a splintered substrate. In addition, the risk of injury caused by splinters can be reduced owing to the splinter shield effect of the radiation decoupling layer.

In the case of embodiments having two partial layers, the microstructured partial layer has in particular a thickness of at least 10 µm, generally at least 25 µm. The non-microstructured partial layer has in particular a thickness of at least 10 µm, generally at least 25 µm; if the non-microstructured partial layer comprises light-scattering regions, in particular scattering particles, then the partial layer has in particular a layer thickness of at least 25 µm. At the very least, the two partial layers should have a thickness which is greater than the wavelength of the radiation emitted by the radiation-emitting device in accordance with the invention.

For optimised coupling-in of radiation from the component 1 into the radiation decoupling layer 8, the surface 11 of the radiation decoupling layer facing the component is expediently formed to be planar and in particular unstructured. This is also the case in the presence of mutually spaced apart partial layers for the mutually facing surfaces of the partial layers.

In order to facilitate the transfer of radiation from the substrate 4 into the radiation decoupling layer 8, the material of the radiation decoupling layer is expediently adapted to the substrate in terms of refractive index. A polycarbonate is particularly suitable for this purpose. Polycarbonates have a refractive index of 1.58 to 1.59. This material is effectively adapted in terms of refractive index to a glass substrate, e.g., a borofloat glass substrate with a refractive index of 1.54.

Alternatively or in addition, e.g., an optical gel can be disposed on a refractive index-adapting material between the substrate 4 and the radiation decoupling layer 8. Ideally, in the case of attaching the radiation decoupling layer 8 to the component by means of an adhesion promoting layer, the adhesion promoting layer is designed for refractive index-adaptation. For this purpose, the adhesion promoter preferably has a refractive index which is outside an interval delimited by the refractive indices of the substrate 4 and of the material of the radiation decoupling layer 8 by no more than 20%, preferably by no more than 10%. The refractive index-adapting material preferably has a refractive index which is between that of the substrate and that of the radiation decoupling layer or of the matrix of the radiation decoupling layer.

Radiation decoupling layers which are particularly suitable for a component in accordance with the invention, in particular a component which emits visible light, are described hereinafter.

Acrylates or core-shell acrylates can be used for transparent scattering particles ((scattering) pigments) of the radiation decoupling layer. They preferably have a sufficiently high thermal stability e.g., up to at least 300° C., in order to prevent them from disintegrating at the processing temperatures of the transparent synthetic material, e.g., of the polycarbonate.

Furthermore, the scattering pigments should have no functionalities which result in the degradation of the polymer chain of the transparent synthetic material, e.g., of the polycarbonate. Therefore, for example, Paraloid® from the company Röhm & Haas or Techpolymer® from the company Sekisui can be used effectively for the pigmentation of transparent synthetic materials. A large number of different types are available from these product lines. Acrylates from the Techpolymer series are preferably used.

The light decoupling layer is preferably designed as a synthetic material film which consists of one or more partial layers. At least one (partial) layer of the light decoupling layer contains, in one embodiment, transparent polymer particles having a refractive index different from that of the matrix material. The layer contains in particular 50 to 99.99 wt. %, preferably 70 to 99.99 wt. % of a transparent synthetic material, in particular polycarbonate, and 0.01 to 50 wt. %, preferably 0.01 to 30 wt. %, polymer particles. The particles preferably have an average particle size substantially between 1 and 100 µm, preferably between 1 and 50 µm.

The microstructure is preferably introduced into the surface of the radiation decoupling layer by means of embossed metal rollers.

The radiation decoupling layer in accordance with the invention can be in one piece; it can also be a multilayer composite consisting of at least two films. This composite can be produced by extrusion. Alternatively, separately prefabricated films can be disposed one on top of the other and connected together (so-called lining or lamination).

In order to produce a film by extrusion, the synthetic material granulate, e.g., the polycarbonate granulate is supplied to a filling hopper of an extruder and passes via this into the plasticising system consisting of a screw and cylinder. The synthetic material is conveyed and melted in the plasticising system. The synthetic material melt is compressed by a flat film die. A filter device, a melt pump, stationary mixing elements and further components can be disposed between the plasticising system and the flat film die. The melt leaving the die passes to a calender stack.

All of the following transparent thermoplasts can be used as synthetic materials for the (matrix of the) radiation decoupling layer or for the partial layers 81, 82 of the radiation decoupling layer: polyacrylates, poly(methyl methacrylates) (PMMA; Plexiglas® from the company Röhm), cyclic olefin copolymers (COC; Topas® from the company Ticona; Zenoex® from the company Nippon Zeon or Apel® from the company Japan Synthetic Rubber), polysulfones (Ultrason® from the company BASF or Udel® from the company Solvay), polyesters, such as for example PET or PEN, polycarbonate, polycarbonat/polyester blends, e.g., PC/PET, polycarbonat/polycyclohexylmethanol cyclohexane dicarboxylate (PCCD; Xylecs® from the company GE) and polycarbonat/polybutylene terephthalate (PBT) blends.

A polycarbonate is preferably used. This is particularly suitable, as already described above, for adaptation to an OLED in terms of refractive index. All known polycarbonates are suitable polycarbonates for the production of the film. These are homopolycarbonates, copolycarbonates and thermoplastic polyester carbonates. A suitable polycarbonate preferably has an average molecular weight $\overline{M}_W$ from 18000 to 40000, preferably from 26000 to 36000 and in particular from 28000 to 35000, determined by measuring the relative solution viscosity in dichloromethane or in mixtures of the same weight amounts of phenol/o-dichlorobenzene adjusted by light scattering.

The polycarbonates are preferably produced in accordance with the phase interface method or the melt interesterification method.

The phase interface method for synthesising polycarbonates is described many times in the literature; by way of example, reference is made to H. Schnell, Chemistry and Physics of Polycarbonates, Polymer Reviews, Vol. 9, Interscience Publishers, New York 1964 pages 33 ff., to Polymer Reviews, Vol. 10, "Condensation Polymers by Interfacial and Solution Methods", Paul W. Morgan, Interscience Publishers, New York 1965, chapter VIII, page 325, to Dres. U. Grigo, K. Kircher and P. R- Müller "Polycarbonate" in Becker/Braun, Kunststoff-Handbuch, Vol. 3/1, Polycarbonate, Polyacetale, Polyester, Celluloseester, Carl Hanser Verlag München, Vienna 1992, pages 118-145 as well as to EP-A 0 517 044.

Suitable diphenols are described for example in U.S. Pat. No. 2,999,835, U.S. Pat. No. 3,148,172, U.S. Pat. No. 2,991, 273, U.S. Pat. No. 3,271,367, U.S. Pat. No. 4,982,014 and U.S. Pat. No. 2,999,846, in German laid-open documents 1 570 703, 2 063 050, 2 036 052, 2 211 956 and 3 832 396, French patent document 1 561 518, in the monograph "H. Schnell, Chemistry and Physics of Polycarbonates, Interscience Publishers, New York 1964, pages 28 ff.; pages 102 ff.", and in "D. G. Legrand, J. T. Bendler, Handbook of Polycarbonate Science and Technology, Marcel Dekker New York 2000, pages 72 ff.".

It is also possible to produce polycarbonates from diaryl carbonates and diphenols in accordance with the known polycarbonate method in the melt, the so-called melt interesterification method which is described for example in WO-A 01/05866 and WO-A 01/05867. In addition, interesterification methods (acetate methods and phenylester methods) are described for example in U.S. Pat. No. 3,494,885, U.S. Pat. No. 4,386,186, U.S. Pat. No. 4,661,580, U.S. Pat. No. 4,680, 371 and U.S. Pat. No. 4,680,372, in EP-A 26 120, 26 121, 26 684, 28 030, 39 845, 91 602, 97 970, 79 075, 14 68 87, 15 61 03, 23 49 13 and 24 03 01 as well as in DE-A 14 95 626 and 22 32 977.

Homopolycarbonates and also copolycarbonates are suitable. 1 to 25 wt. %, preferably 2.5 to 25 wt. % (based on the total amount of diphenols to be used), of polydiorganosiloxanes with hydroxy-aryloxy end groups can be used to produce copolycarbonates. They are known (e.g., from U.S. Pat. No. 3,419,634) or can be produced in accordance with methods known from the literature. The production of copolycarbonates containing polydiorganosiloxane is described for example in DE-OS 33 34 782.

Furthermore, polyester carbonates and block copolyester carbonates are suitable, as described for example in WO 2000/26275.

Aromatic dicarboxylic acid dihalides for producing aromatic polyester carbonates are preferably diacid dichlorides of isophthalic acid, terephthalic acid, diphenyl ether 4,4'-dicarboxylic acid and naphthalene-2,6-dicarboxylic acid.

The aromatic polyester carbonates can be linear and can also be branched in a known manner (see also in this respect DE-OS 29 40 024 and DE-OS 30 07 934).

The polydiorganosiloxane-polycarbonate block polymers can also be mixture of polydiorganosiloxane-polycarbonate block copolymers with conventional polysiloxane-free, thermoplastic polycarbonates, wherein the total content of polydiorganosiloxane structural units in this mixture is approximately 2.5 to 25 wt. %.

Such polydiorganosiloxane-polycarbonate block copolymers are known for example from U.S. Pat. No. 3,189,662, U.S. Pat. No. 3,821,325 and U.S. Pat. No. 3,832,419.

Preferred polydiorganosiloxane-polycarbonate block copolymers are produced in that alpha, omega-bishydroxyaryloxy end group-containing polydiorganosiloxanes are converted together with other diphenols, possibly with the simultaneous use of branchers in typical amounts, e.g., pursuant to the two-phase interface method (see in this respect H. Schnell, Chemistry and Physics of Polycarbonates Polymer Rev. Vol. IX, pages 27 ff., Interscience Publishers New York 1964), wherein in each case the ratio of bifunctional phenolic reactants is selected such that a suitable amount of aromatic carbonate structural units and diorganosiloxy units results therefrom.

Such alpha, omega-bishydroxyaryloxy end group-containing polydiorganosiloxanes are known for example from U.S. Pat. No. 3,419,634.

Those particles disclosed in EP-A 634 445 are preferably used as polymer particles on an acrylate basis for scattering particles.

The polymer particles have a core consisting of a rubber-like vinyl polymer. The rubber-like vinyl polymer can be a homopolymer or copolymer from any one of the monomers which have at least one ethylene-like unsaturated group and which undergo an addition polymerisation—as is generally known—under the conditions of the emulsion polymerisation in an aqueous medium. Such monomers are listed in U.S. Pat. No. 4,226,752, column 3, lines 40-62.

In a most preferred manner, the polymer particles contain a core consisting of rubber-like alkylacrylate polymers, wherein the alkyl group has 2 to 8 carbon atoms, optionally copolymerised with 0 to 5% crosslinker and 0 to 5% graft crosslinker, based on the total weight of the core. The rubber-like alkylacrylate is preferably copolymerised with up to 50% of one or more copolymerisable vinyl monomers, e.g., the ones stated above. Suitable crosslinking and graft crosslinking monomers are described for example in EP-A 0 269 324.

The polymer particles contain one or more shells. These one or more shells are preferably produced from a vinyl homopolymer or copolymer. Suitable monomers for the production of the shell(s) are disclosed in U.S. Pat. No. 4,226, 752, column 4, lines 20-46, details of which are incorporated herein by reference. One or more shells are preferably a polymer consisting of a methacrylate, acrylate, vinylarene, vinyl carboxylate, acrylic acid and/or methacrylic acid.

The polymer particles are useful to provide the transparent synthetic material, preferably polycarbonate, with light scattering properties.

The polymer particles preferably have an average particle diameter (average particle size) of at least 0.5 µm, preferably of at least 1 µm to at most 100 µm, more preferably of 2 to 50 µm, most preferably of 2 to 30 µm. "Average particle diameter" is understood to mean the number average. Preferably at least 90%, most preferably at least 95%, of the polymer particles have a diameter of more than 1 µm and less than 100 µm. The polymer particles are preferably a free-flowing powder, preferably in compacted form.

The polymer particles can be produced in the following manner: generally, at least one monomer component of the core polymer is subjected to emulsion polymerisation with the formation of emulsion polymer particles. The emulsion polymer particles are swollen with the same or one or more other monomer components of the core polymer and the monomer(s) is/are polymerised within the emulsion polymer particles. The swelling and polymerising steps can be repeated until the particles have grown to the desired core size. The core polymer particles are suspended in a second aqueous monomer emulsion and a polymer shell consisting of the monomer(s) is polymerized onto the polymer particles in the second emulsion. One or more shells can be polymerised onto the core polymer. The production of core/shell polymer particles is described in EP-A 0 269 324 and in U.S. Pat. Nos. 3,793,402 and 3,808,180.

The radiation decoupling layer is preferably produced by extrusion.

For the extrusion, a polycarbonate granulate is for example supplied to the extruder and melted in the plasticising system of the extruder. The synthetic material melt is pressed through a flat film die and shaped therein, brought to the desired final shape in the nip of a calender stack and fixed in shape by cooling on both sides on polishing rolls and by the ambient air. The polycarbonates with a high melt viscosity which are used for the extrusion are conventionally processed at melt temperatures of 260 to 320° C., and the cylinder temperatures of the plasticising cylinder and die temperatures are adjusted accordingly.

By using one or more side extruders and suitable melt adapters upstream of the flat film die, polycarbonate melts of different compositions or even—as described above—melts of other polymers can be placed one on top of the other, thus producing multi-layer films (see e.g., EP-A 0 110 221 and EP-A 0 110 238).

The production of the radiation decoupling layer is explained in more detail with reference to the following example:

A two-layer film having a light scattering layer and geometric structural layer

Example A

Production of a Master Batch by Compounding

The master batch is produced using conventional twin-screw compounding extruders (e.g., ZSK 32) at processing temperatures of 250 to 330° C. which are typical for polycarbonate.

A master batch having the following composition was produced:
1. 80 wt. % Makrolon® 3108 550115 (polycarbonate (PC) from the company Bayer MaterialScience AG)
2. 20 wt. % scattering particles (Techpolymer® MBX 5 from the company Sekisui) having a particle size of 2 to 15 µm and an average particle size of 8 µm.

The apparatus used for producing the radiation decoupling layers consists of (i) a main extruder having a screw with a diameter (D) of 105 mm and a length of 41×D; the screw has a venting zone; (ii) a triple-roller calender stack with the rollers arranged horizontally, wherein the third roller can be pivoted by +/−45° with respect to the horizontal; (iii) a roller track; (iv) a device for applying, on both sides, a protective film; (v) a discharge device; (vi) winding station.

The following light scattering composition was supplied to the main extruder:
1. 50.0 wt. % Makrolon® 3108 550115 (PC from the company Bayer MaterialScience AG)
2. 50.0 wt. % master batch (as described under A))

Example B

The granulate of the material for the layer having the geometric structure Makrolon 2600 was supplied to the filling hopper of the coextruder. The materials were melted and conveyed in the plasticising system cylinder/screw of the extruders. The material melt was supplied to the calender stack whose rollers were at the temperatures stated in the table below. The final shaping and cooling of the radiation decoupling layer was performed on the calender stack (consisting of three rollers). The structure shown in FIG. 4 was milled into the surface of roller 2. A rubber roller was used for texturing the opposite surface. The rubber roller used for structuring the surface is disclosed in U.S. Pat. No. 4,368,240 from the company Nauta Roll Corporation. Then, the film was transported via a discharge.

TABLE

| Process parameter | |
|---|---|
| Temperature of the main extruder | approx. 275° C. |
| Temperature of the coextruder | approx. 260° C. |
| Temperature of the deviating head | approx. 285° C. |
| Temperature of the die | approx. 300° C. |
| Rotational speed of the main extruder | 45 min$^{-1}$ |
| Temperature of rubber roller 1 | 24° C. |
| Temperature of roller 2 | 72° C. |
| Temperature of roller 3 | 131° C. |
| Discharge speed | 21.5 m/min |

The scattering properties of the radiation decoupling layer or the partial layer which contains the scattering sites can be expediently and simply described by means of the Henyey-Greenstein phase function P $$P(\cos\theta) = \frac{1-g^2}{4\pi(1+g^2-2g\cos\theta)^{\frac{3}{2}}}$$

Here, θ is the intermediate angle between a beam incident upon the radiation decoupling layer and this beam after scattering. If transmission occurs in the radiation decoupling layer, then θ is formed between the (imaginary) continuation of the incident beam on the exit side and the exiting beam.

The scattering anisotropy factor g (g factor) describes the scattering properties of the radiation decoupling layer. This g-factor is between −1 and 1, wherein a value of −1 corresponds to mirror-like backscattering, a value of 0 corresponds to isotropic scattering and a value of 1 corresponds to no change in the beam progression. g-factors greater than 0 indicate forward scattering. The g-factor can be obtained experimentally.

In a preferred embodiment, the radiation decoupling layer 8 or the partial layer 81 containing scattering regions is formed such that the g-factor is 0.3 to 0.9, preferably 0.5 to 0.7. The amount of radiated power which can be decoupled can be considerably increased hereby.

Figure 5:
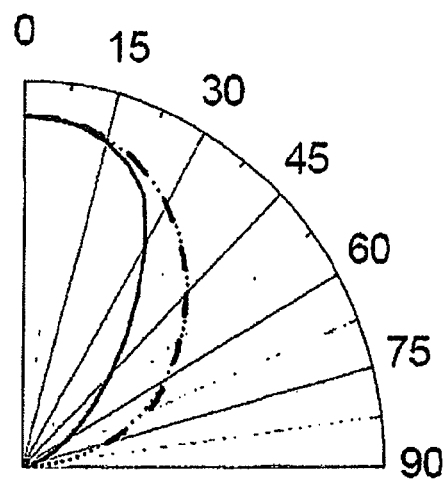
FIGS. 5 A-C show the dependence of the decoupled radiated power upon the observation angle for the devices in accordance with the invention.
Figure 5:
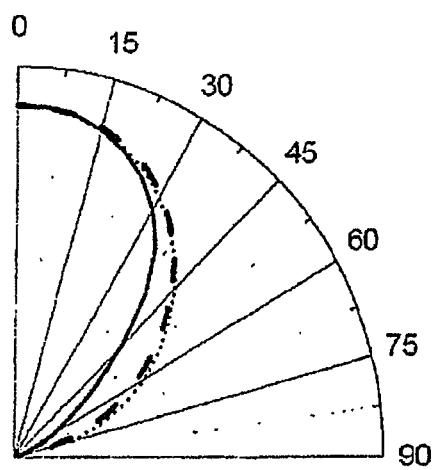
Figure 5:
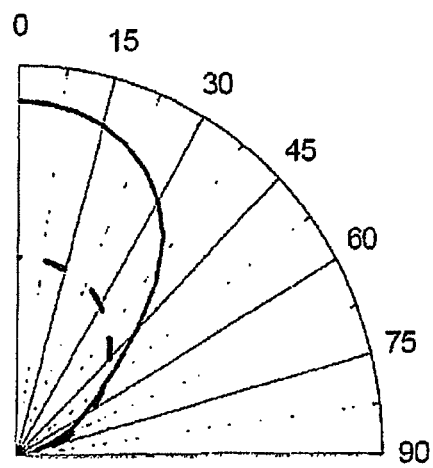

FIGS. 5A, 5B and 5C show the proportion of decoupled radiated power depending upon the observation angle (0-90°) for an OLED. In addition, the emission profile of a Lambertian emitter is shown. An OLED emitting white light was used for measuring purposes. The OLED used comprises a radiation decoupling layer, consisting of two partial layers, having a thickness of 188 µm (partial layer with structural elements) and 300 µm (partial layer with scattering particles). The partial layer lying closer to the substrate contains, as the scattering particles, 10 wt. % Techpolymer MBX 5 (from the company Sekisui) and, as the matrix material, Makrolon 3108. All the experiments were conducted with a current density of 4.3 mA/cm². An observation angle of 0° in FIG. 5 A-C corresponds to an observation angle along the surface normal or normal vector (as described above).

FIG. 5 A shows the standardised emission profile for an arrangement having a microstructure in the form of microlenses having mutually spaced-apart partial layers as a continuous line (the spaced-apart arrangement is achieved by the surface roughness of the partial layer which contains the geometric structural elements). The dashed line shows the standardised emission profile of a corresponding arrangement which does not comprise a radiation decoupling layer. The dotted line shows the emission profile of a Lambertian emitter. An OLED having a radiation decoupling layer formed in this manner is particularly suitable for radiation sources which are disposed comparatively far removed from the object to be illuminated (e.g., ceiling lights in rooms); the intensity of the decoupled radiation is increased with respect to an arrangement without a radiation decoupling layer in particular in the case of observation angles between −30 and +30 degrees.

FIG. 5 B shows the standardised emission profile for an arrangement having a microstructure as shown in FIG. 4. The individual structural elements have a rotationally-symmetrical geometry (height of the structure 70 to 74 µm, spacing of the maxima 103 µm) and mutually spaced-apart partial layers are present (the spaced-apart arrangement is achieved by the surface roughness of the partial layer which contains the geometric structural elements)—illustrated as a continuous line. The dashed line shows the standardised emission profile of a corresponding arrangement which does not comprise a radiation decoupling layer. The dotted line shows the emission profile of a Lambertian emitter. An OLED having a radiation decoupling layer formed in this manner is particularly suitable for radiation sources which are disposed relatively close to the object to be irradiated (for instance task lights e.g., for workstation or dining table lighting); the intensity of the decoupled radiation is increased with respect to an arrangement without a radiation decoupling layer not only in the case of observation angles between −30 and +30 degrees but also for observation angles between −30 and −45 degrees or between +30 and +45 degrees. FIG. 5 C shows the emission profile from FIG. 5 B in a non-standardised form.

By means of the OLEDs in accordance with the invention, the efficiency can be increased and the light density can be considerably increased along the surface normal. The luminous efficiency of an OLED in accordance with the invention is generally at least 20 µm/W, at the same time the light density at 0° is generally at least 1400 cd/m²: irrespective of the light density at 0°, the luminous efficiency is preferably at least 22 µm/W; irrespective of the luminous efficiency, the light density at 0° is typically at least 1550 cd/m², preferably at least 1650 cd/m² and particularly preferably at least 1800 cd/m².

The following table shows the increase in efficiency and the increase in light density along the surface normal using specific examples. The measurements were conducted using an arrangement as described for FIGS. 5 A-C:

| Particle content□ [wt. %]/thickness◇ [µm] | Geometric structural elements | Spaced-apart partial layers | Luminous efficiency [1 m/W] | Light density at 0° [cd/m²] |
|---|---|---|---|---|
| 4/100 | MLA | yes | 20.7 | 1597 |
| 10/100 | MLA | yes | 23.0 | 1819 |
| 10/200 | MLA | yes | 22.3 | 1834 |
| 10/300 | MLA | yes | 22.5 | 1858 |
| no layer | MLA | yes | 17.5 | 1457 |
| 2/300 | MLA | no | | 1422 |
| no layer | MLA | no | | 1579 |
| 2/300 | no layer | no | | 1207 |
| no radiation decoupling layer | | | 21.5 | 981 |

* MLA = microlens array
□ as scattering particles, Techpolymer MBX 5 (company: Sekisui) was used in Makrolon 3108 as the matrix
◇ layer thickness of the partial layer containing the scattering particles
All experiments were carried out at a current density of 4.3 mA/cm².

The table shows that an arrangement having a microstructure with regularly disposed geometric structural elements (in the form of a microlens array) produces a considerably increased light density at 0°. An additional increase can be achieved by arrangements having spaced-apart partial layers. Furthermore, the table shows that by increasing the particle content, the light density at 0° and also the luminous efficiency clearly increase and when increasing the layer thickness of the layer containing the particles, an additional increase in the light density at 0° is achieved.

In addition to the increased decoupling, in particular at observation angles of 0 to 45°, a further advantage of the radiation decoupling layer in accordance with the invention resides in the fact that variations in the colour locus can be reduced. The colour locus (also referred to as chromaticity coordinate) can change in particular with the viewing angle. Such colour locus variations are intrinsically provided in many OLEDs. Colour locus variations, i.e., variations in the x- and/or y-coordinates according to the CIE (Commission internationale de l'éclairage), can be reduced by means of the radiation decoupling layer in accordance with the invention (cf. FIG. 6). For variations of the colour locus Δx and Δy, the following values are generally applicable in the case of the devices in accordance with the invention (in the case of measurements for the viewing angles of 0 to 45°): $\Delta x \leq 0.1$ and/or $\Delta y \leq 0.05$. Frequently, $\Delta x \leq 0.07$ and/or $\Delta y \leq 0.025$ and in many cases $\Delta x \leq 0.04$ and/or $\Delta y \leq 0.015$. The difference Δx and Δy is defined as follows: $\Delta x = x_{max} - x_{min}$ and $\Delta y = y_{max} - y_{min}$, wherein $x_{max}$ and $y_{max}$ are the maximum x or y values measured for a viewing angle between 0 and 45° and $x_{min}$ and $y_{min}$ are the minimum x or y values measured for a viewing angle between 0 and 45°.

Figure 6:
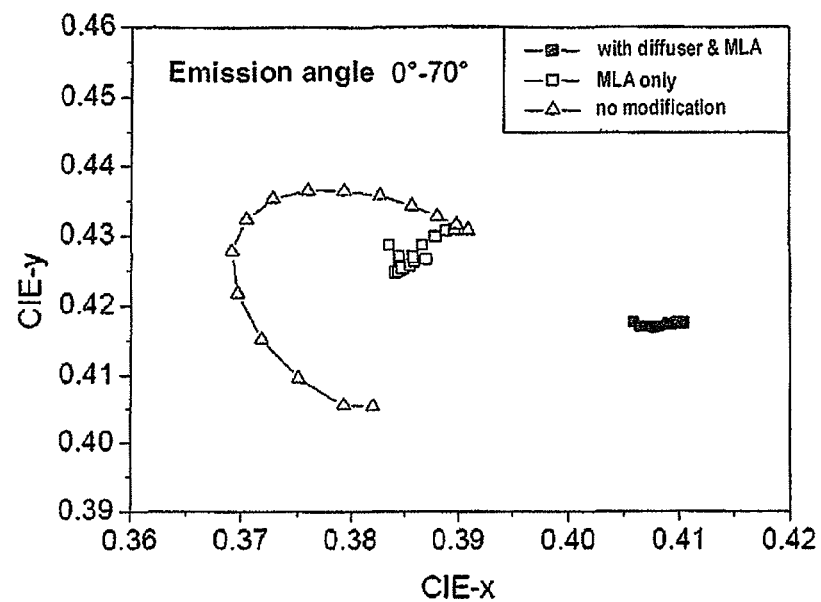
FIG. 6 shows the dependence of the CIE colour coordinates x and y upon the observation angle for various embodiments of the device in accordance with the invention, and for a device having a radiation decoupling layer without a microstructure.
Figure 6:
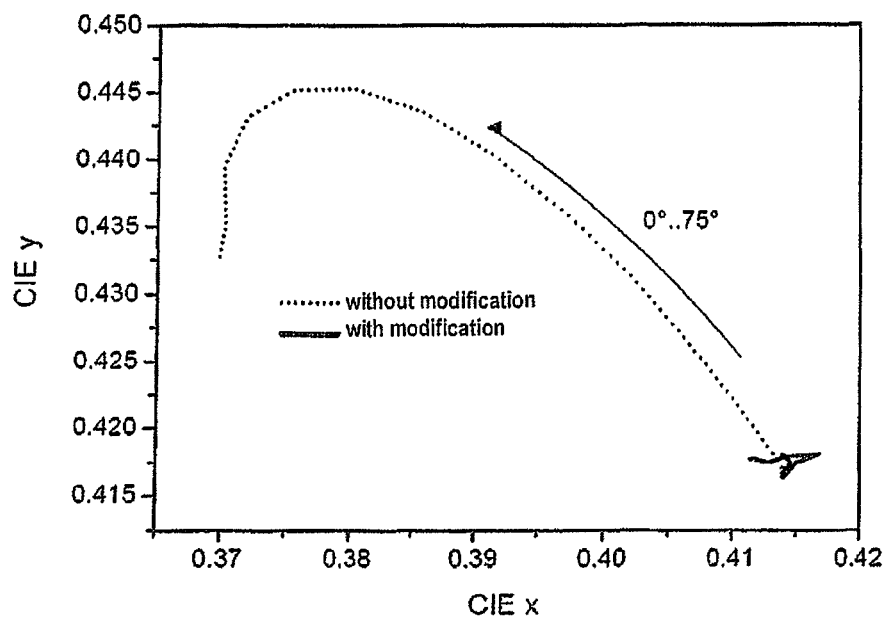
Figure 6:
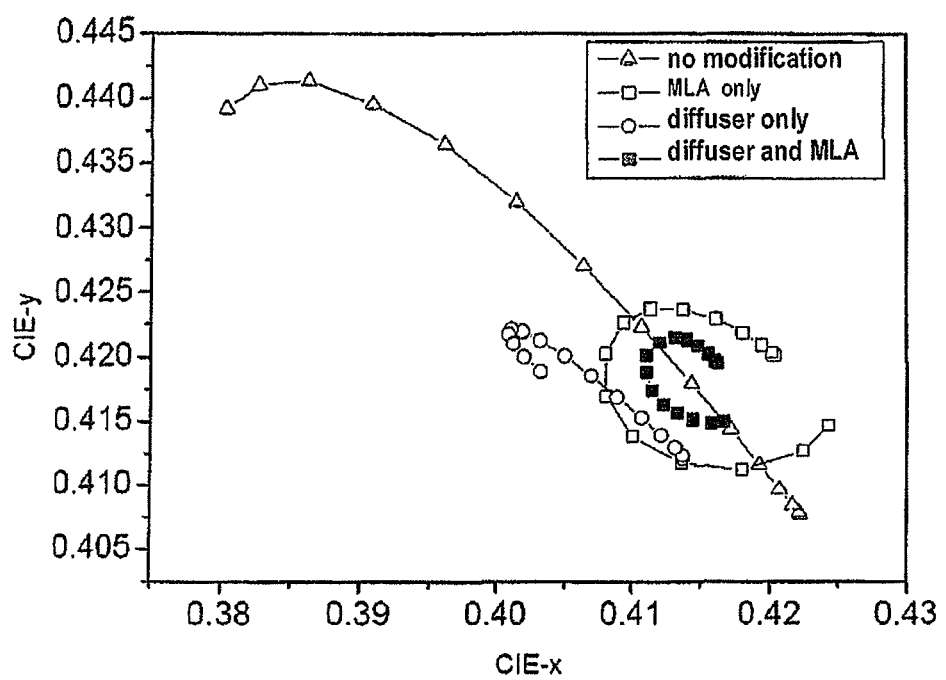

FIG. 6 A shows the CIE coordinates for emission (or observation) angles of 0°- to 70° (measured in 5° steps). The measuring points for an arrangement having a microstructure in the form of microlenses having mutually-spaced apart partial layers are shown as filled-in squares (FIG. 5 A—continuous line—also uses the same arrangement as a basis). The measuring points for the same arrangement having a microstructure in the form of microlenses having mutually spaced part partial layers but without a partial layer containing scattering particles are shown as empty squares.

The triangles show the measuring points for a corresponding arrangement which does not comprise a radiation decoupling layer (the 0° value has an x value of about 0.39; FIG. 5 A—dashed line—also uses the same arrangement as a basis).

FIG. 6 B shows the CIE coordinates for emission (or observation) angles of 0°- to 75°. The measured values for an arrangement having a microstructure in accordance with FIG.

4 having mutually spaced-apart partial layers are shown as a continuous line (FIG. 5 B—continuous line—also uses the same arrangement as a basis). The measured values for a corresponding arrangement which does not comprise a radiation decoupling layer are shown as a dotted line (the 0° value has an x value of about 0.415; FIG. 5 B—dashed line—also uses the same arrangement as a basis).

FIG. 6 C shows the CIE coordinates for emission (or observation) angles of 0°- to 70° (measured in 5° steps). The measuring points for an arrangement having a microstructure in the form of microlenses are shown as filled-in squares. In contrast to FIG. 6 A, in this case an embodiment is provided with partial layers which are not mutually spaced-apart. The measuring points for the same arrangement having a microstructure in the form of microlenses but without a partial layer containing scattering particles are shown as empty squares. The measuring points for an arrangement without a microstructure but with scattering particles are shown as empty circles. The triangles show the measuring points for a corresponding arrangement which does not comprise a radiation decoupling layer nor any scattering particles.

The invention is not limited by the description using the exemplified embodiments. On the contrary, the invention includes any new feature and any combination of features included in particular in any combination of features in the Claims.

The invention claimed is:

1. A radiation-emitting device, comprising an organic radiation-emitting functional layer, which emits a primary radiation, and a radiation decoupling layer, which is disposed in a beam path of the primary radiation, wherein the radiation decoupling layer comprises, on a side remote from the radiation-emitting functional layer, a microstructure having regularly disposed geometric structural elements, and at least partial regions of the radiation decoupling layer contain regions which effect scattering of the primary radiation, the radiation decoupling layer further comprising a matrix which comprises a polymer which is transparent to the primary radiation,
    wherein each one of the geometric structural elements has exactly one light decoupling surface facing away from the radiation-emitting functional layer, said light decoupling surfaces being continuously differentiable, and
    wherein each planar curve, extending from a maximum of a respective one of the geometric structural elements to a base thereof, comprises in its lower third nearest to the radiation-emitting functional layer only curvatures which are smaller than any curvature in a corresponding upper third of the planar curve, the upper third being the third that is most remote from the radiation-emitting functional layer.

2. The radiation-emitting device as claimed in claim 1, wherein the light-scattering regions comprise at least one selected from the group consisting of particles, hollow particles and gas inclusions.

3. The radiation-emitting device as claimed in claim 1, wherein the light-scattering regions comprise an average diameter of 0.5 to 100 µm.

4. The radiation-emitting device as claimed in claim 1, wherein the geometric structural elements each comprise a base surface which is a polygon.

5. The radiation-emitting device as claimed in claim 1, wherein the microstructure can be embossed into a surface of the radiation decoupling layer using a metal roller.

6. The radiation-emitting device as claimed in claim 1, wherein the maxima of mutually adjacent geometric structural elements comprise a spacing of 30 to 500 µm.

7. The radiation-emitting device as claimed in claim 1, wherein the partial regions are not present in the region of the geometric structural elements.

8. The radiation-emitting device as claimed in claim 1, wherein the radiation decoupling layer is disposed directly on a side of a substrate, of a barrier layer or of a transparent electrode, which in each case is remote from the radiation-emitting functional layer.

9. The radiation-emitting device as claimed in claim 1, wherein the radiation decoupling layer comprises at least two mutually spaced-apart partial layers, wherein a gas is present between the partial layers and wherein mutually facing boundary surfaces of the partial layers extend substantially in parallel with one another and extend substantially in parallel with a surface of the radiation decoupling layer facing the radiation-emitting functional layer.

10. The radiation-emitting device as claimed in claim 9, wherein a support structure is disposed between the mutually spaced-apart partial layers.

11. The radiation-emitting device as claimed in claim 1, which is formed as an OLED.

12. The radiation-emitting device as claimed in claim 1, which is provided for lighting purposes, in particular for lighting over a large area.

13. The radiation-emitting device as claimed in claim 1, wherein the light-scattering regions comprise an average diameter of 2 to 20 µm.

14. The radiation-emitting device as claimed in claim 1, wherein the maxima of mutually adjacent geometric structural elements comprise a spacing of 100 to 250 µm.

15. The radiation-emitting device as claimed in claim 10, wherein said support structure consists of a transparent material.

16. The radiation-emitting device as claimed in claim 1, wherein the light-scattering regions comprise scattering particles which are of a core-shell construction.

17. The radiation-emitting device as claimed in claim 1, wherein said polymer which is transparent to the primary radiation is a polycarbonate.

18. A radiation-emitting device, comprising an organic radiation-emitting functional layer, which emits a primary radiation, and a radiation decoupling layer, which is disposed in a beam path of the primary radiation, wherein the radiation decoupling layer comprises first and second geometric structural elements,
    wherein the radiation decoupling layer comprises, on a side remote from the radiation-emitting functional layer, a microstructure having the first geometric structural elements regularly disposed therein, and at least one partial layer of the radiation decoupling layer contains regions which comprise the second geometric structural elements that effect scattering of the primary radiation,
    wherein each one of the first geometric structural elements has exactly one light decoupling surface facing away from the radiation-emitting functional layer, said light decoupling surfaces being continuously differentiable, and
    wherein each planar curve, extending from a maximum of a respective one of the first geometric structural elements to a base thereof, comprises in its lower third nearest to the radiation-emitting functional layer only curvatures which are smaller than any curvature in a corresponding upper third of the planar curve, the upper third being the third that is most remote from the radiation-emitting functional layer,
    wherein the at least one partial layer is arranged between the microstructure and the organic radiation-emitting functional layer, and the at least one partial layer comprises a matrix which is mixed with scattering particles in a statistical distribution, the scattering particles constituting the second geometric structural elements,
wherein the matrix and the scattering particles are formed from radiation-permeable polymers,
wherein the scattering particles are polymer particles having a core-shell morphology or the scattering particles are polymer hollow particles,
wherein said first and second geometric structural elements have volumes that differ by at least 50 percent,
wherein the first and second geometric structural elements alternate in a regular manner, and
wherein the partial layer with the scattering particles is in direct contact with the radiation-emitting functional layer and with the radiation decoupling layer comprising the microstructure.

* * * * *